(12) United States Patent
Kim et al.

(10) Patent No.: US 12,532,698 B2
(45) Date of Patent: Jan. 20, 2026

(54) MICRO-SEMICONDUCTOR CHIP TRANSFER APPARATUS AND CHIP EXTRACTION APPARATUS

(71) Applicant: SAMSUNG ELECTRONICS CO., LTD., Suwon-si (KR)

(72) Inventors: Dongkyun Kim, Suwon-si (KR); Minchul Yu, Suwon-si (KR); Kyungwook Hwang, Seoul (KR); Hyunjoon Kim, Seoul (KR); Joonyong Park, Suwon-si (KR); Seogwoo Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 575 days.

(21) Appl. No.: 18/075,078

(22) Filed: Dec. 5, 2022

(65) Prior Publication Data
US 2023/0197477 A1   Jun. 22, 2023

(30) Foreign Application Priority Data
Dec. 17, 2021   (KR) .......................... 10-2021-0182017

(51) Int. Cl.
*H01L 21/68* (2006.01)
*H01L 21/67* (2006.01)
*H01L 21/673* (2006.01)

(52) U.S. Cl.
CPC .................. *H01L 21/67132* (2013.01); *H01L 21/67051* (2013.01); *H01L 21/67333* (2013.01); *H01L 21/68* (2013.01)

(58) Field of Classification Search
CPC ......... H01L 21/67132; H01L 21/67051; H01L 21/67333; H01L 21/68; H01L 21/6835; H01L 25/0753; H01L 2221/68354; H01L 2221/68363; H01L 24/95; H01L 2224/95001; H01L 2224/95101; H01L 2924/12041; H01L 2221/68304; H01L 21/67144; H01L 2221/68368; H10H 20/01; H10H 20/85
See application file for complete search history.

(56) References Cited

U.S. PATENT DOCUMENTS 7,080,444 B1   7/2006   Craig et al.
7,861,405 B2 *   1/2011   Chow .................... H01L 24/95
                                                       438/106

(Continued)

FOREIGN PATENT DOCUMENTS

EP            3937263 A1 *   1/2022   .......... H10H 20/857
WO      2021/236552 A1     11/2021

OTHER PUBLICATIONS

Communication dated May 17, 2023, issued by the European Patent Office in European Application No. 22209392.4.

*Primary Examiner* — Eduardo A Rodela
(74) *Attorney, Agent, or Firm* — Sughrue Mion, PLLC

(57) ABSTRACT

A micro-semiconductor chip transfer apparatus includes: a wet chip supply module configured to supply a plurality of micro-semiconductor chips and liquid onto a transfer substrate; a chip alignment module including an absorber configured to move along a surface of the transfer substrate while absorbing the liquid; and a chip extraction module configured to extract, from the absorber, the micro-semiconductor chips remaining in the absorber.

21 Claims, 25 Drawing Sheets

(56) References Cited

U.S. PATENT DOCUMENTS

| | | |
|---|---|---|
| 9,240,145 B2 | 1/2016 | Ichioka et al. |
| 10,115,862 B2 | 10/2018 | Zhan et al. |
| 10,211,364 B2 | 2/2019 | Schuele et al. |
| 10,242,977 B2 | 3/2019 | Sasaki et al. |
| 10,243,097 B2 | 3/2019 | Yuen |
| 10,276,754 B2 | 4/2019 | Sasaki et al. |
| 10,418,527 B2 | 9/2019 | Sasaki et al. |
| 10,930,819 B2 | 2/2021 | Sasaki et al. |
| 11,296,059 B2 * | 4/2022 | Sasaki ................. H01L 25/0753 |
| 12,230,525 B2 * | 2/2025 | Hwang ............... H01L 21/6835 |
| 2019/0172968 A1 | 6/2019 | Yuen |
| 2020/0152826 A1 | 5/2020 | Lee et al. |
| 2021/0091052 A1 | 3/2021 | Schuele et al. |
| 2021/0091257 A1 | 3/2021 | Hwang et al. |
| 2021/0119079 A1 | 4/2021 | Hwang et al. |
| 2021/0397045 A1 | 12/2021 | Hwang et al. |
| 2022/0013400 A1 | 1/2022 | Hwang et al. |
| 2022/0029046 A1 | 1/2022 | Hong et al. |
| 2022/0102602 A1 | 3/2022 | Hwang et al. |
| 2022/0189810 A1 | 6/2022 | Hwang et al. |
| 2023/0154769 A1 | 5/2023 | Kim et al. |
| 2024/0006199 A1 * | 1/2024 | Kim ....................... H10H 20/01 |

\* cited by examiner

MICRO-SEMICONDUCTOR CHIP TRANSFER APPARATUS AND CHIP EXTRACTION APPARATUS

CROSS-REFERENCE TO RELATED APPLICATION

This application is based on and claims priority under 35 U.S.C. § 119 to Korean Patent Application No. 10-2021-0182017, filed on Dec. 17, 2021, in the Korean Intellectual Property Office, the disclosure of which is incorporated by reference herein in its entirety.

BACKGROUND

1. Field

The disclosure relates to micro-semiconductor chip transfer apparatuses capable of reusing micro-semiconductor chips.

2. Description of the Related Art

Liquid crystal displays (LCDs) and organic light-emitting diode (OLED) displays have been widely used as display devices. Recently, there has been an increasing interest in a technology for manufacturing high-resolution display devices by using micro-light-emitting diodes.

Micro-semiconductor chips, e.g., light-emitting diodes (LEDs), have advantages of low power consumption and environmental friendliness. Owing to these advantages, the industrial demand for LEDs has increased. In manufacturing micro-LED display devices, it is necessary to transfer micro-LEDs to a substrate. A pick-and-place method has been widely used for transferring micro-LEDs. However, the pick-and-place method causes a decrease in productivity as the size of a micro-LED decreases and the size of a display increases.

SUMMARY

Provided are micro-semiconductor chip transfer apparatuses capable of reusing micro-semiconductor chips.

Additional aspects will be set forth in part in the description which follows and, in part, will be apparent from the description, or may be learned by practice of the presented embodiments of the disclosure.

According to an aspect of the disclosure, there is provided a micro-semiconductor chip transfer apparatus for wet-aligning a plurality of micro-semiconductor chips in a plurality of grooves of a transfer substrate, the micro-semiconductor chip transfer apparatus including: a wet chip supply module configured to supply the plurality of micro-semiconductor chips and a first liquid onto the transfer substrate in a flowable manner; a chip alignment module comprising an absorber configured to move along a surface of the transfer substrate to align first micro-semiconductor chips, among the plurality of micro-semiconductor chips, respectively in the plurality of grooves and to absorb the first liquid; and a chip extraction module configured to extract, from the absorber, second micro-semiconductor chips, among the plurality of micro-semiconductor chips, which are attached to the absorber.

The chip extraction module may include a liquid spray cleaner configured to spray a second liquid to the absorber to extract the second micro-semiconductor chips from the absorber.

The liquid spray cleaner may be configured to be rotatable or movable.

The chip extraction module may include a holder configured to fix the absorber.

The chip extraction module may include an ultrasonic cleaner configured to emit ultrasonic waves towards the absorber to extract the second micro-semiconductor chips from the absorber.

The chip extraction module may include a vibration cleaner configured to vibrate the absorber to extract the second micro-semiconductor chips from the absorber.

The wet chip supply module may include a liquid supply module configured to supply the first liquid, and a chip supply module configured to supply the plurality of micro-semiconductor chips.

The wet chip supply module may be further configured to supply a suspension containing the plurality of micro-semiconductor chips and the first liquid.

The chip alignment module may further include a supply roller to supply the absorber, a recovery roller to recover the absorber, a roller arranged between the supply roller and the recovery roller to support the absorber, and a pressing roller to press the absorber to contact with the transfer substrate.

The chip alignment module and the chip extraction module may be arranged adjacent to each other, and the chip alignment module and the chip extraction module may be provided between the supply roller and the recovery roller, and the absorber is supported between the supply roller and the recovery roller to be continuously moved from the chip alignment module to the chip extraction module.

The chip extraction module may be a reservoir, and a plurality of rollers may be arranged above the reservoir to guide and move the absorber.

The micro-semiconductor chip transfer apparatus may further include an inspection module configured to inspect a state of the transfer substrate.

The micro-semiconductor chip transfer apparatus may further include a controller configured to control operations of the wet chip supply module and the chip alignment module, based on a result of inspection performed by the inspection module.

The micro-semiconductor chip transfer apparatus may further include a cleaning module configured to remove dummy micro-semiconductor chips remaining on the surface of the transfer substrate.

The chip extraction module may further include a recovery module configured to recover the second micro-semiconductor chips separated from the transfer substrate.

The chip extraction module may further include a filtration module configured to separate impurities from the micro-semiconductor chips extracted by the chip extraction module.

The chip extraction module may further include an antistatic module configured to supply, onto the transfer substrate, ions for preventing an occurrence of static electricity.

The absorber may include a woven, a tissue, polyester fiber, paper, or a wiper.

The micro-semiconductor chip may be one of a micro-light-emitting device, a pressure sensor, a photodiode, a thermistor, or a piezoelectric device.

According to another aspect of the disclosure, there is provided a chip extraction apparatus including: a holder configured to hold an absorber configured to move along a surface of the transfer substrate to absorb liquid from a transfer substrate during a wet alignment process; a cleaner configured to release micro-semiconductor chips attached to the absorber during the wet alignment process; and a container configured to collected the micro-semiconductor chips released from the absorber.

The cleaner may include a liquid spray cleaner configured to spray liquid onto the absorber to release the micro-semiconductor chips attached to the absorber during the wet alignment process.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
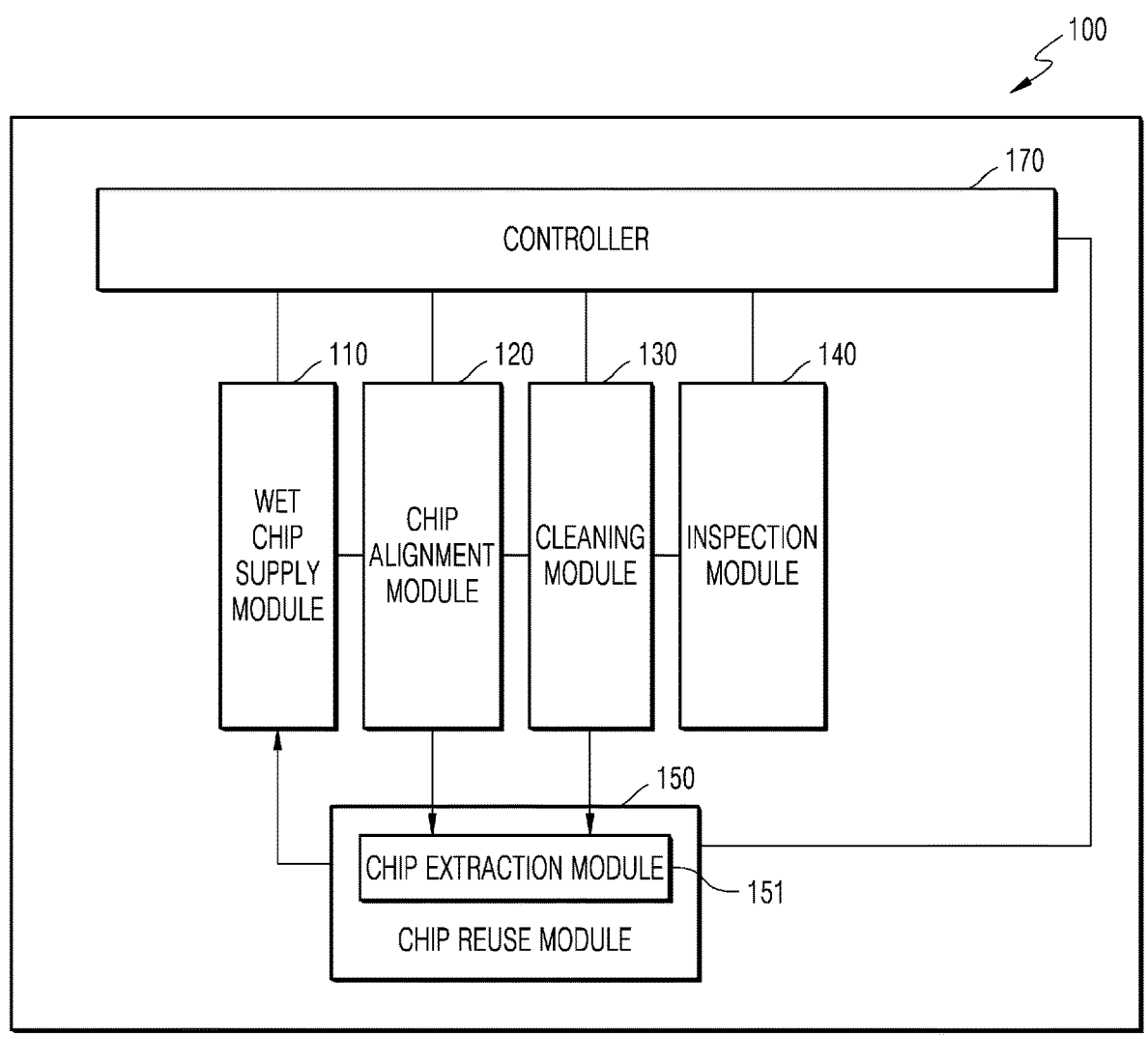
FIG. 1 is a block diagram of a micro-semiconductor chip transfer apparatus according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a micro-semiconductor chip transfer apparatus according to various embodiments will be described in detail with reference to the accompanying drawings. In the following drawings, like reference numerals refer to like elements, and sizes of elements in the drawings may be exaggerated for clarity and convenience of description. Terms such as "first" or "second" may be used to describe various elements, but the elements should not be limited by the terms. These terms are only used to distinguish one element from another element.

The singular expression also includes the plural meaning as long as it is not inconsistent with the context. In addition, when an element is referred to as "including" a component, the element may additionally include other components rather than excluding other components as long as there is no particular opposing recitation. In the following drawings, the size or thickness of each element in the drawings may be exaggerated for clarity of description. Also, when a material layer is referred to as being "on" another substrate or layer, the material layer may be directly on the another substrate or layer, or a third layer may also be present therebetween. In addition, materials constituting each layer in the embodiments below are exemplary, and other materials than the described ones may also be used.

Also, the terms described in the specification, such as " . . . er (or)", " . . . unit", " . . . module", etc., denote a unit that performs at least one function or operation, which may be implemented as hardware or software or a combination thereof.

Particular implementations described in the embodiments are merely exemplary, and do not limit the scope of the disclosure in any way. For the sake of conciseness, descriptions of related art electronic configurations, control systems, software, and other functional aspects of the systems may be omitted. In addition, the lines or connecting elements between elements shown in the drawings are intended to represent exemplary functional relationships and/or physical or logical couplings between the various elements, and many alternative or additional functional relationships, physical connections or logical connections may be present in a practical device.

The term "the" and other demonstratives similar thereto should be understood to include a singular form and plural forms.

The operations of a method may be performed in any suitable order unless otherwise indicated herein or otherwise clearly contradicted by context. In addition, all example terms (e.g., "such as" or "etc.") are used for the purpose of description and are not intended to limit the scope of the disclosure unless defined by the claims.

FIG. 1 is a block diagram schematically illustrating a micro-semiconductor chip transfer apparatus 100 according to an example embodiment, and FIGS. 2, 3A, 3B and 4 are diagrams illustrating transfer substrates 10, 10A, and 10B according to example embodiments.

Figure 2:
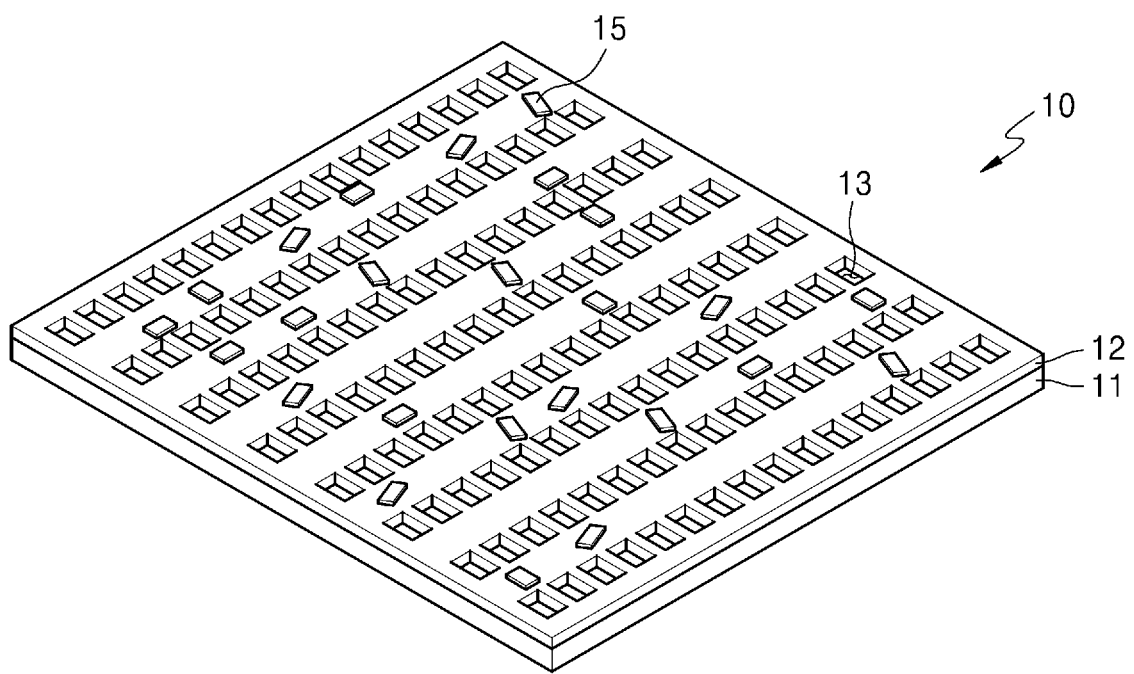
FIGS. 2, 3A, 3B and 4 are diagrams illustrating transfer substrates of a micro-semiconductor chip transfer apparatus according to example embodiments.

Referring to FIGS. 1 and 2, in the micro-semiconductor chip transfer apparatus 100 may align a plurality of micro-semiconductor chips 15 in a plurality of grooves 13 of a transfer substrate 10. According to an example embodiment, the micro-semiconductor chip transfer apparatus 100 may be a wet alignment apparatus configured to perform wet alignment of the plurality of micro-semiconductor chips 15 in a plurality of grooves 13 of a transfer substrate 10 during a transfer process. The micro-semiconductor chip transfer apparatus 100 includes a wet chip supply module 110, a chip alignment module 120, a cleaning module 130, an inspection module 140, and a chip reuse module 150. According to an example embodiment, the chip reuse module 150 may include a chip extraction module 151. Moreover, the micro-semiconductor chip transfer apparatus 100 may include a controller 170 for controlling operations of the wet chip supply module 110 and the chip alignment module 120.

According to an example embodiment, the controller 170 may include a processor and a memory. For example, the controller may include a memory storing one or more instructions or program codes, and the processor is further configured to execute the one or more instructions to control operations of one or more of the wet chip supply module 110, the chip alignment module 120, the cleaning module 130, the inspection module 140, and the chip reuse module 150.

Figure 3A:
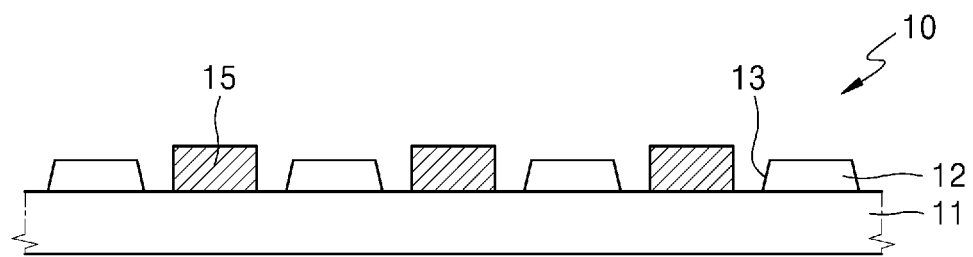

Referring to FIG. 3A, the transfer substrate 10 may include the plurality of grooves 13 into which the micro-semiconductor chips 15 may be provided, respectively. According to an example embodiment, the micro-semiconductor chips 15 may be placed or inserted into the plurality of grooves 13. Each of the plurality of grooves 13 may have a size such that at least a portion of one of the micro-semiconductor chips 15 may be placed into one of the groove. For example, the groove 13 may have a microscopic size. For example, the size of the groove 13 may be less than 1000 μm, e.g., 500 μm or less, 200 μm or less, or 100 μm or less. The size of the groove 13 may be greater than the size of the micro-semiconductor chip 15.

The pitch between the plurality of grooves 13 may correspond to the pitch between adjacent micro-semiconductor chips 15 inserted into adjacent grooves 13. For example, when the micro-semiconductor chips 15 are light-emitting devices, the pitch between the plurality of grooves 13 may correspond to the pixel pitch of a display device used in a final product. For example, the pitch between adjacent grooves among the plurality of grooves 13 may correspond to the pixel pitch of a display device used in the final product. However, the pitch between the plurality of grooves 13 is not limited thereto, and may be variously changed as necessary.

Figure 3B:
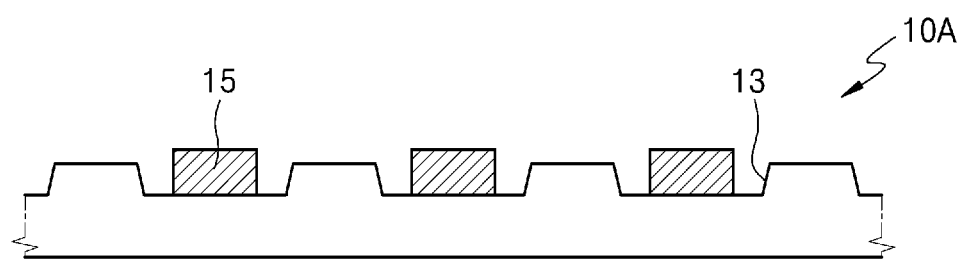
Figure 4:
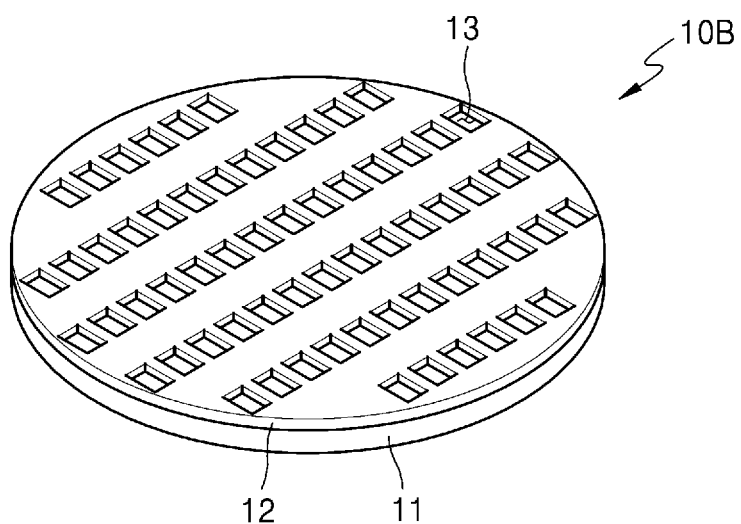

Referring to FIG. 3A, the transfer substrate 10 may include a plurality of layers. For example, the transfer substrate 10 may include a base substrate 11 and a guide mold 12. According to an example embodiment, materials of the base substrate 11 and the guide mold 12 may be different from each other. However, the disclosure is not limited thereto, and as such, the base substrate 11 and the guide mold 12 may be the same as each other. Alternatively, as illustrated in FIG. 3B, the transfer substrate 10A may be configured as a single layer. In addition, the plane shape of the transfer substrate 10 may be a quadrangle as illustrated in FIG. 2, but is not limited thereto, and for example, the plane shape of the transfer substrate 10B may be a circle as illustrated in FIG. 4 according to another example embodiment.

Figure 5:
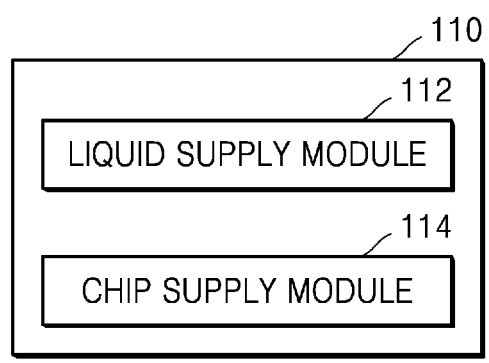
FIG. 5 is a block diagram of a wet chip supply module of a micro-semiconductor chip transfer apparatus according to an example embodiment.
Figure 6:
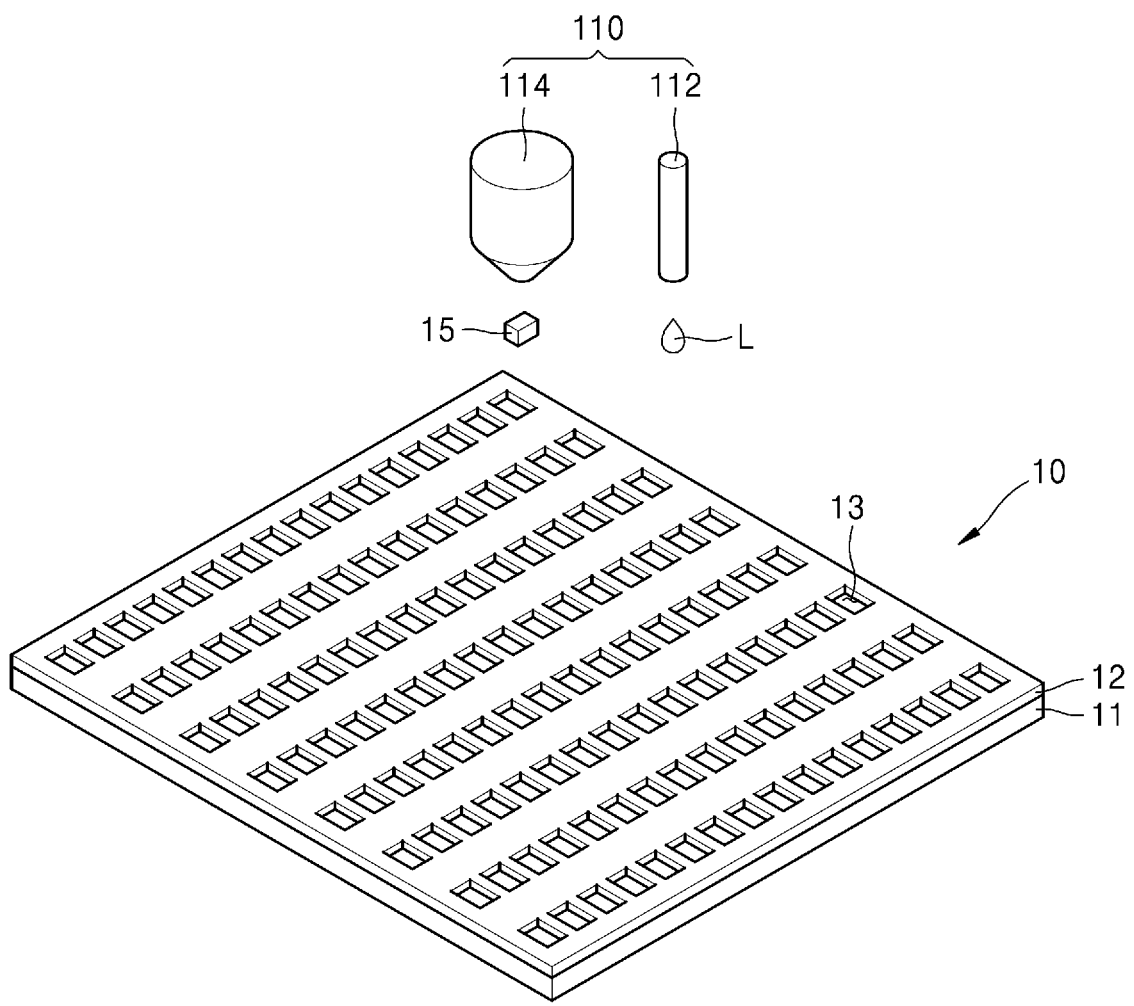
FIG. 6 illustrates an example of a wet chip supply module of a micro-semiconductor chip transfer apparatus according to an example embodiment.

FIG. 5 is a block diagram of the wet chip supply module 110. The wet chip supply module 110 may include a liquid supply module 112 for supplying a liquid onto the transfer substrate 10 and a chip supply module 114 for supplying the plurality of micro-semiconductor chips 15 onto the transfer substrate 10. FIG. 6 illustrates an example of the wet chip supply module 110 supplying liquid L and the micro-semiconductor chips 15 onto the transfer substrate 10. The liquid supply module 112 may supply the liquid L toward the transfer substrate 10 to fill the grooves 13 with the liquid L. The chip supply module 114 may supply the micro-semiconductor chips 15 onto the transfer substrate 10. Although FIG. 6 illustrates an example in which the liquid supply module 112 and the chip supply module 114 are separately provided, the wet chip supply module 110 may include a suspension including the micro-semiconductor chips 15 and be configured as a single module to supply the suspension onto the transfer substrate 10. According to an example embodiment, the liquid supply module 112 may be a container configured to contain liquid L and the chip supply module 114 may be a container configured to contain micro-semiconductor chips 15.

Referring back to FIG. 1, the micro-semiconductor chip transfer apparatus 100 may include a cleaning module 130. The cleaning module 130 may be configured to remove dummy micro-semiconductor chips remaining on the surface of the transfer substrate 10 after the plurality of micro-semiconductor chips 15 are completely aligned respectively in the plurality of grooves 13 by the chip alignment module 120. The cleaning module 130 may remove the dummy micro-semiconductor chips in various manners. For example, the cleaning module 130 may include an absorber, and remove the dummy micro-semiconductor chips by moving the absorber in contact with the transfer substrate 10. According to an example embodiment, the cleaning module 130 may use a new absorber when removing the dummy micro-semiconductor chips by moving the absorber in contact with the transfer substrate. However, the disclosure is not limited thereto, and as such, according to another example embodiment, the cleaning module 130 may use the same absorber when removing the dummy micro-semiconductor chips by moving the absorber in contact with the transfer substrate.

The micro-semiconductor chip transfer apparatus 100 may further include an inspection module 140 for inspecting a state of the transfer substrate 10. The inspection module 140 may be a camera capable of high-resolution image analysis. The inspection module 140 may inspect the state of the transfer substrate 10 through image analysis.

For example, the inspection module 140 may inspect the alignment state of the micro-semiconductor chips 15 on the transfer substrate 10. Based on a result of inspection by the inspection module 140, the controller 170 may control at least one of the wet chip supply module 110 and the chip alignment module 120 to operate. Through this process, the accuracy of alignment of the plurality of micro-semiconductor chips 15 may be improved.

For example, in a result of inspection by the inspection module 140, the position of the groove 13 into which none of the plurality of micro-semiconductor chips 15 is inserted may be identified among the plurality of grooves 13 of the transfer substrate 10. In this case, based on the result of inspection by the inspection module 140, the controller 170 may control at least one of the wet chip supply module 110 and the chip alignment module 120 to operate around the position of the groove 13 in which none of the plurality of micro-semiconductor chips 15 is inserted.

As another example, the inspection module 140 may inspect the supply state of the micro-semiconductor chips 15 and the liquid L on the transfer substrate 10. For example, the inspection module 140 may inspect whether the liquid L is present on the transfer substrate 10, or whether the amount of the liquid L on the transfer substrate 10 is sufficient. Based on a result of inspection by the inspection module 140, the controller 170 may control the liquid supply module 112 to operate to either provide the liquid L onto the transfer substrate 10 or stop providing the liquid L onto the transfer substrate 10.

Moreover, the inspection module 140 may inspect whether the micro-semiconductor chips 15 are present on the transfer substrate 10, or whether the quantity of micro-semiconductor chips 15 on the transfer substrate 10 is sufficient. Based on a result of inspection by the inspection module 140, the controller 170 may control the chip supply module 114 to operate to either provide the micro-semiconductor chips 15 onto the transfer substrate 10 or stop providing the micro-semiconductor chips 15 onto the transfer substrate 10.

As described above, based on a result of inspection by the inspection module 140, the controller 170 may control at least one of the wet chip supply module 110 and the chip alignment module 120 to operate, thereby improving the accuracy of alignment of the plurality of micro-semiconductor chips 15.

Figure 7:
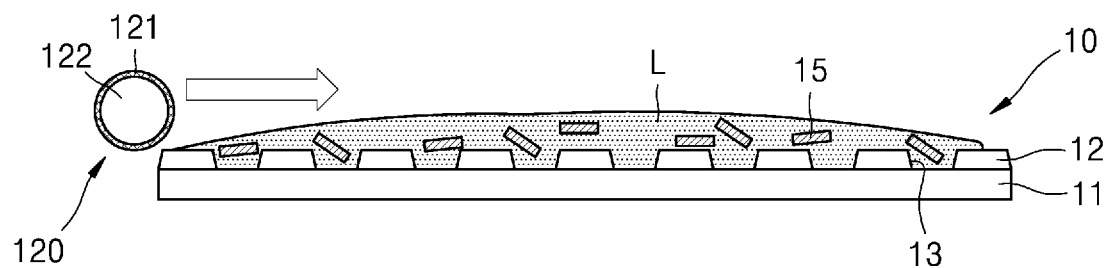
FIG. 7 illustrates an example of a chip alignment module of a micro-semiconductor chip transfer apparatus according to an example embodiment.

Referring to FIG. 7, the liquid L supplied onto the transfer substrate 10 forms a thin layer on the transfer substrate 10, and at least a portion of each of the plurality of micro-semiconductor chips 15 may be immersed in the liquid L.

According to an example embodiment, because the plurality of micro-semiconductor chips 15 are immersed in the liquid L, they may be flowable above the transfer substrate 10. In this case, the plurality of micro-semiconductor chips 15 may flow in the liquid L supplied onto the transfer substrate 10, and the layer of the liquid L may be thinly formed on the transfer substrate 10 to prevent or minimize unintended flow by the chip alignment module 120, which will be described below.

The liquid L may be any type of liquid as long as it does not corrode or damage the micro-semiconductor chips 15. For example, the liquid L may include at least one of water, ethanol, alcohol, polyol, ketone, halocarbon, acetone, flux, and an organic solvent. The organic solvent may include, for example, isopropyl alcohol (IPA). The liquid L is not limited thereto, and may be variously changed.

The micro-semiconductor chip 15 may be a semiconductor device having a microscopic size, for example, a micro-light-emitting device, a pressure sensor, a photodiode, a thermistor, a piezoelectric device, or the like.

Referring to FIG. 7, the chip alignment module 120 includes an absorber 121 that absorbs the liquid L. The transfer substrate 10 may be scanned by using the absorber 121. The chip alignment module 120 may move the absorber 121 along the surface of the transfer substrate 10. The absorber 21 may move along the surface of the transfer substrate 10 while in contact with the transfer substrate 10.

The absorber 121 may include, for example, a woven, a tissue, fiber, paper, or a wiper. The fiber may be, for example, natural fiber such as cotton or silk, or artificial fiber such as nylon, polyester, or acryl. However, the absorber 121 is not limited thereto, and may be any material that absorbs the liquid L. The absorber 121 may include, for example, a wiper formed of microfiber (e.g., a micro-denier wiper). The microfiber has a thickness of 0.5 denier or less, and has a liquid absorption rate greater than that of a cotton material. The absorber 121 may be made of a woven and a knit.

Figure 8:
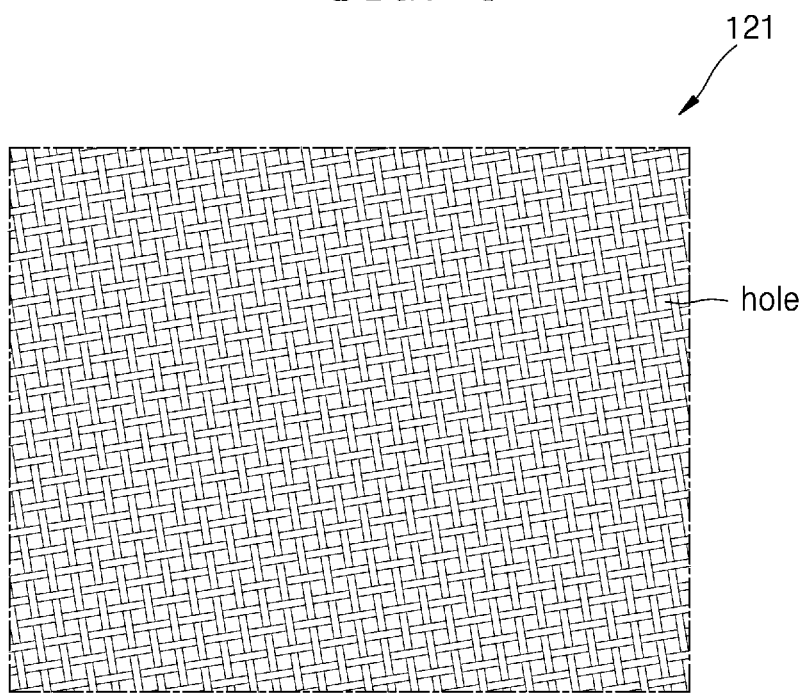
FIG. 8 illustrates an example of an absorber used in a micro-semiconductor chip transfer apparatus according to an example embodiment.

FIG. 8 illustrates an example of the absorber 121. A woven is made of horizontal yarns (wefts) and vertical yarns (warps), which are entangled with each other to form fabric, and has a strength greater than that of a knit. The absorber 121 may have a mesh structure capable of absorbing the liquid L. The absorber 121 has a plurality of mesh holes, the size of which may be less than that of the micro-semiconductor chip 15 to prevent the micro-semiconductor chip 15 from being stuck or caught therein.

The absorber 121 may be used alone without any other auxiliary mechanisms. However, the disclosure is not limited thereto, and the absorber 121 may be coupled to a support 122 such that scanning of the transfer substrate 10 using the absorber 121 is facilitated. The support 122 may have various shapes and structures suitable for scanning the transfer substrate 10. The support 122 may include, for example, a rod, a blade, a plate, or a wiper. The absorber 121 may be provided on one surface of the support 122, or may be wound around the support 122.

The chip alignment module 120 may scan the transfer substrate 10 while the absorber 121 presses the transfer substrate 10 with an appropriate pressure. When the chip alignment module 120 performs scanning, the absorber 121 may be in contact with the transfer substrate 10 and traverse the plurality of grooves 13. During the scanning, the liquid L may be absorbed by the absorber 121.

The scanning may be performed in various manners including, for example, at least one of sliding, rotating, translating, reciprocating, rolling, spinning, and rubbing of the absorber 121, and may be performed in a regular or irregular manner. Alternatively, the scanning may include at least one of rotating, translating, rolling, and spinning of the transfer substrate 10. Alternatively, the scanning may be performed by cooperation between the absorber 121 and the transfer substrate 10. For example, while the absorber 121 presses the transfer substrate 10, the transfer substrate 10 may move or rotate to perform scanning.

Scanning the transfer substrate 10 with the absorber 121 may include absorbing the liquid L in the plurality of grooves 13 by moving the absorber 121 to traverse the plurality of grooves 13. While the absorber 121 traverses the grooves 13, the liquid L in the grooves 13 is absorbed, and in this process, the micro-semiconductor chips 15 may be aligned in the grooves 13.

Figure 9:
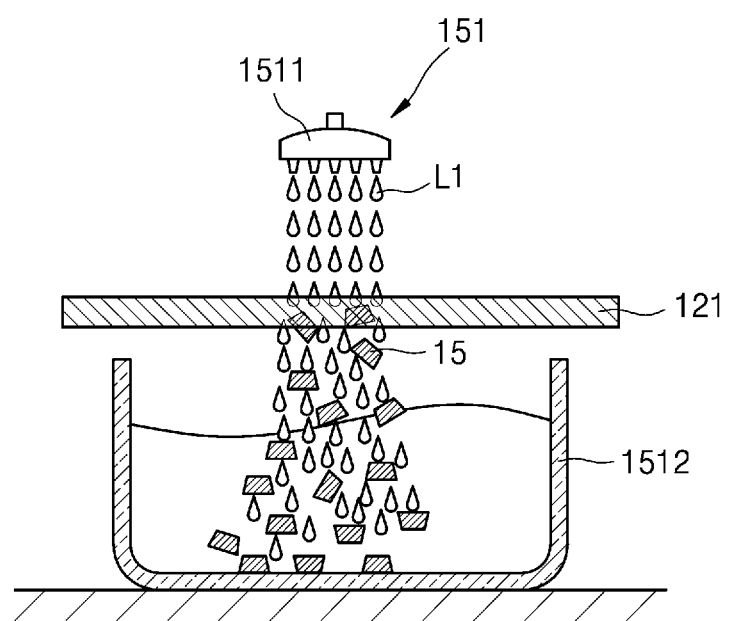
FIGS. 9 to 13 illustrate examples in which a chip extraction module of a micro-semiconductor chip transfer apparatus includes a liquid spray cleaner, according to example embodiments.

FIG. 9 illustrates an example of a chip extraction module 151 included in a chip reuse module 150. The chip extraction module 151 may extract and collect the micro-semiconductor chips 15 remaining on the absorber 121 after the scanning of the transfer substrate 10 using the absorber 121. For example, the chip extraction module 151 may include a liquid spray cleaner 1511 configured to provided liquid L1 to the absorber 121 to extract the micro-semiconductor chips 15 from the absorber 121. Here, the liquid L1 may comprise same liquid as the liquid L supplied onto the transfer substrate 10. According to an example embodiment, the liquid spray cleaner 1511 may be configured to inject or spray the liquid L1 to the absorber 121 to extract the micro-semiconductor chips 15 from the absorber 121. The liquid spray cleaner 1511 may be arranged at various positions at which it is able to effectively extract the micro-semiconductor chips 15 from the absorber 121. For example, the liquid spray cleaner 1511 may be arranged above the absorber 121, and spray the liquid L1 toward the absorber 121 such that the micro-semiconductor chips 15 remaining on the absorber 121 are separated from the absorber 121. A reservoir 1512 may be provided under the absorber 121, and the micro-semiconductor chips 15 separated from the absorber 121 may be collected in the reservoir 1512.

In addition, the liquid spray cleaner 1511 may be movable to uniformly spray a liquid to the entire absorber 121, or selectively spray the liquid to a certain region of the absorber 121.

The liquid spray cleaner 1511 may include a pressure device, a flow control valve, a solenoid valve, a pressure gage, one or more nozzles, etc., to spray high-pressure droplets. The area to which the droplets are sprayed may be set to be wider than the area of the absorber 121 in which the micro-semiconductor chips 15 are attached during the scanning process. The liquid spray cleaner 1511 may include a plurality of nozzles to simultaneously spray a liquid to a wide area of the absorber 121, or may include a single nozzle to spray liquid while moving the nozzle. The liquid spray cleaner 1511 including one nozzle may be configured to spray a liquid while rotating the nozzle.

The liquid L1 may be any type of liquid as long as it does not corrode or damage the micro-semiconductor chips 15 and the absorber 121. For example, the liquid L1 may include at least one of water, ethanol, alcohol, polyol, ketone, halocarbon, acetone, flux, or an organic solvent. The organic solvent may include, for example, IPA. The liquid L1 is not limited thereto, and may be variously changed.

Figure 10:
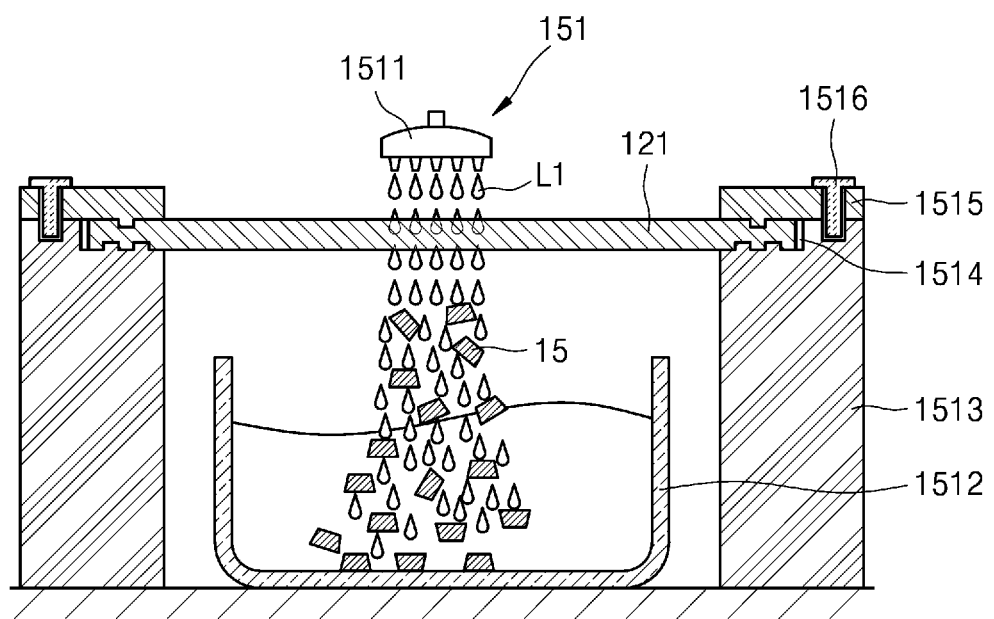

FIG. 10 illustrates an example in which the chip extraction module 151 further includes a frame for supporting the absorber 121 according to an example embodiment. For example, the chip extraction module 151 may include support walls 1513 each including a holder 1514 capable of holding both ends of the absorber 121, and a cover 1515 provided on the support walls 1513 to cover the holders 1514. The support walls 1513 and the cover 1515 may be coupled to each other by coupling members 1516, e.g., bolts, and the both ends of the absorber 121 may be fixed by the holders 1514, respectively. The distance between the support walls 1513 may be adjustable, and may be adjusted according to the width of the absorber 121 to tightly hold the ends of the absorber 121.

Figure 11:
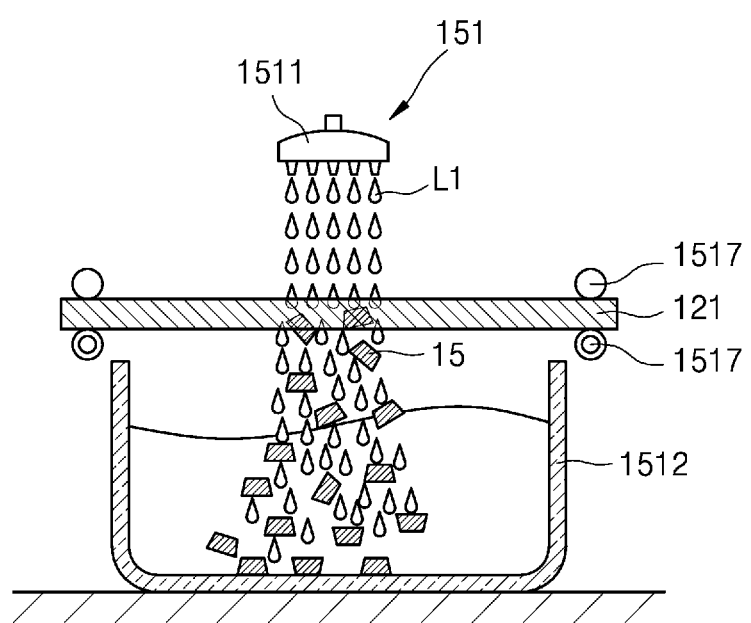

FIG. 11 illustrates an example of a modification of the structure of the chip extraction module 151 for supporting the absorber 121 illustrated in FIG. 10, according to another example embodiment.

The chip extraction module 151 may include two or more pairs of rollers 1517 at upper and lower portions of the absorber 121. The absorber 121 may be guided and movably supported by the rollers 1517. When the absorber 121 is moved by the rollers 1517, the micro-semiconductor chips 15 may be extracted from a wide area of the absorber 121 being moved. Alternatively, as described below, the absorber 121 may be configured to be continuously moved in a roll-to-roll structure, from the chip alignment module 120 to the chip extraction module 151.

Figure 12:
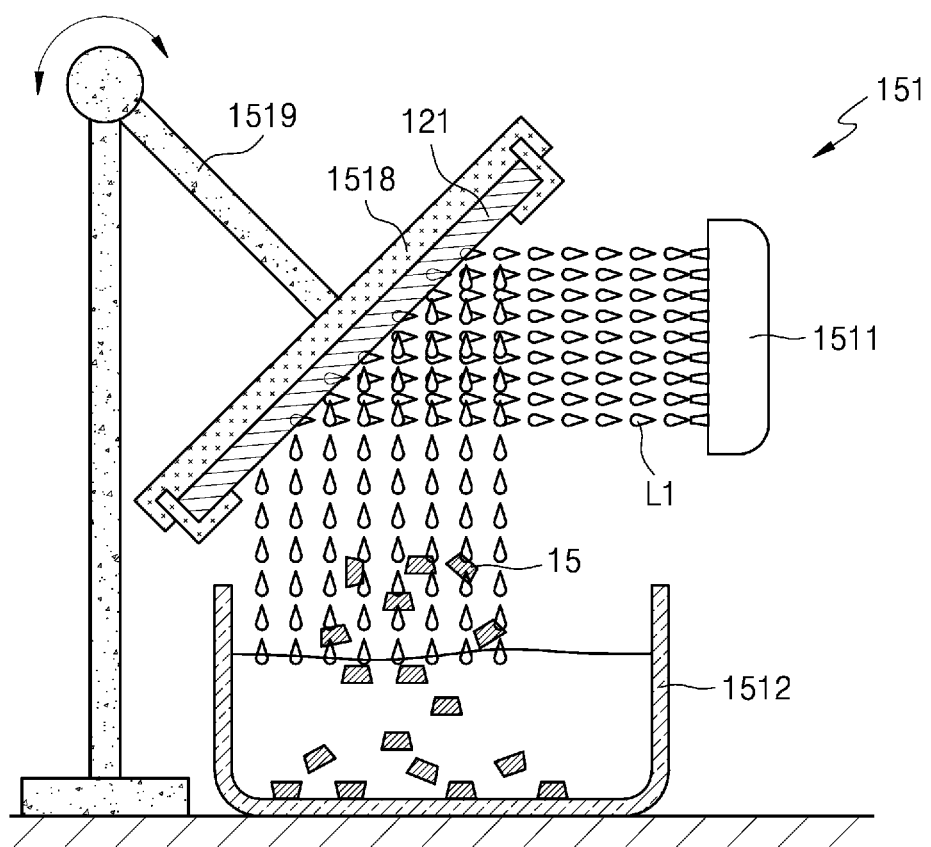

FIG. 12 illustrates another example of the chip extraction module 151 according to another example embodiment. The chip extraction module 151 may include a frame 1518 for supporting the absorber 121 and a rotatable arm 1519 coupled to the frame 1518 and for adjusting the slope of the frame 1518. The liquid spray cleaner 1511 may be positioned to spray the liquid L1 toward the absorber 121. As the slope of the frame 1518 is adjusted, the liquid L1 may be sprayed onto the entire absorber 121, and thus, the rate of recovery of the micro-semiconductor chips 15 from the absorber 121 may increase.

Figure 13:
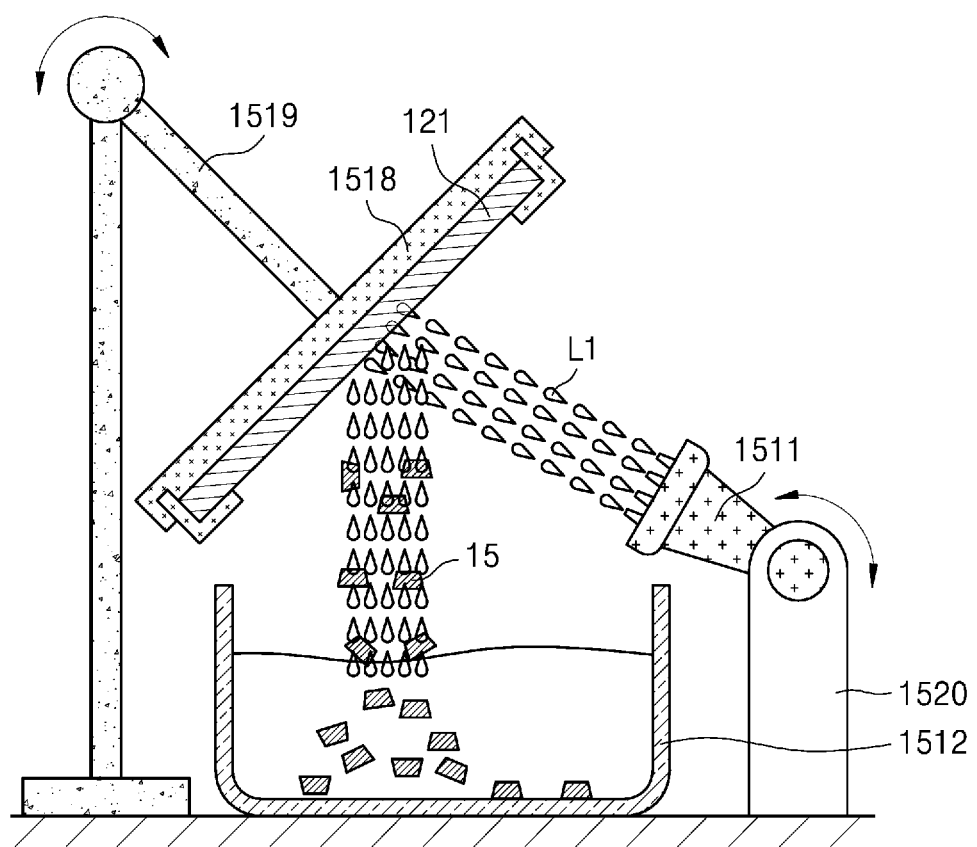

FIG. 13 illustrates another example embodiment in which the chip extraction module illustrated in FIG. 12 further includes a rotary roll support 1520 capable of rotating the liquid spray cleaner 1511.

The rotary roll support 1520 may rotate the liquid spray cleaner 1511 to adjust the angle of the liquid spray cleaner 1511 toward the absorber 121. The liquid spray cleaner 1511 may be moved to spray the liquid L1 to the entire absorber 121, and thus, the rate of recovery of the micro-semiconductor chips 15 may increase. According to an example embodiment, the liquid spray cleaner 1511 may be attached to a rotatable arm of the rotary roll support 1520. The micro-semiconductor chips 15 may be rapidly and efficiently extracted by, selectively, adjusting the slope of the absorber 121 by using the rotatable arm 1519 and/or adjusting the slope of the liquid spray cleaner 1511 by using the rotary roll support 1520.

Figure 14:
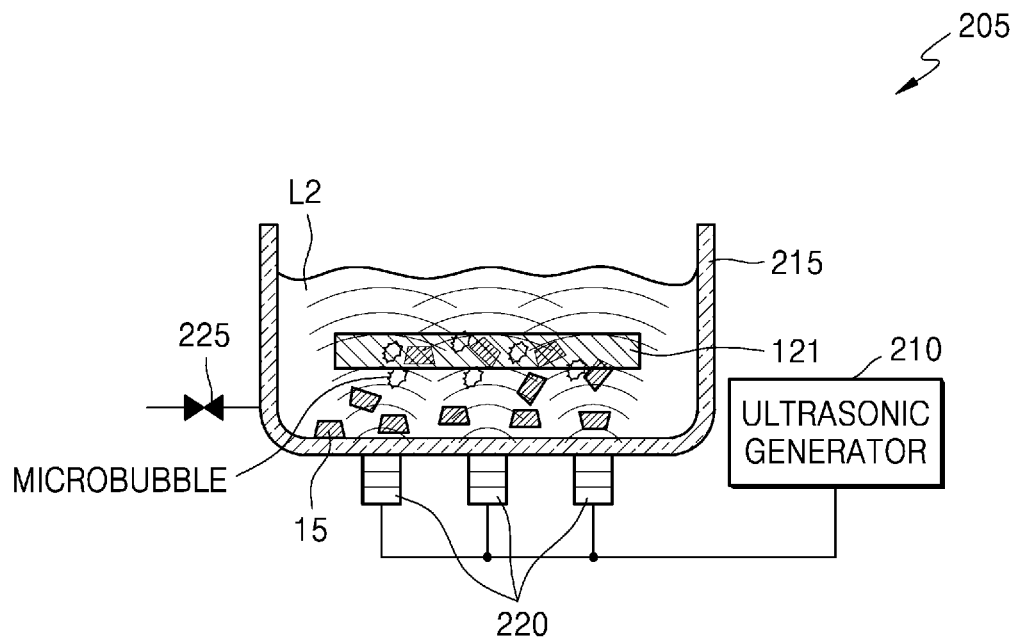
FIGS. 14 and 15 illustrate examples in which a chip extraction module of a micro-semiconductor chip transfer apparatus includes an ultrasonic cleaner, according to example embodiments.

FIG. 14 illustrates an example in which a chip extraction module 251 includes an ultrasonic cleaner 205 according to another example embodiment.

The ultrasonic cleaner 205 may be configured to extract the micro-semiconductor chips 15 from the absorber 121 by emitting ultrasonic waves to the absorber 121. The ultrasonic cleaner 205 may include a reservoir 215 for accommodating liquid L2, ultrasonic transducers 220 attached below the reservoir 215 to generate ultrasonic waves, and an ultrasonic generator 210 for applying an electrical signal of a certain frequency to the ultrasonic transducers 220. The inner wall of the reservoir 215 may be surface-treated such that the micro-semiconductor chips 15 do not adhere thereto, or may be made of a material to which the micro-semiconductor chips 15 do not adhere.

The ultrasonic transducers 220 may be coupled to the reservoir 215 accommodating the liquid L2 to vibrate the reservoir 215 such that microbubbles are formed by vibration energy and thus the micro-semiconductor chips 15 adhered to the absorber 121 are extracted. The extracted micro-semiconductor chips 15 may sink to the bottom of the reservoir 215, and then be collected by opening a valve 225 coupled to the reservoir 215.

The ultrasonic cleaner 205 may extract the micro-semiconductor chips 15 from the absorber 121 by using a cavitation effect of ultrasonic waves. Cavitation refers to a phenomenon in which a change in the pressure of a medium, e.g., the liquid L2, caused by a change in the speed of the medium when ultrasonic waves propagate through the medium, causes the formation of microbubbles (cavities) in the medium. The micro-semiconductor chips 15 may be extracted by using the cavitation effect and the particle acceleration effect of ultrasonic waves. By using such effects, the micro-semiconductor chips 15 stuck between the surface and the inner fiber tissue of the absorber 121 may be extracted. The microbubbles formed due to propagation of the ultrasonic waves reach the surface of the absorber 121 or even penetrate into the absorber 121, and then burst at a high pressure to generate energy. Consequently, the micro-semiconductor chips 15 remaining on the surface and inside the absorber 121 are withdrawn to the outside.

The degree of cavitation is proportional to the surface tension of the liquid L2 and is inversely proportional to the temperature, the frequency, the amount of dissolved gas, and the vapor pressure of the liquid L2. Accordingly, as the temperature of the liquid L2 increases, the degree of cavitation decreases, and thus it is preferable to perform ultrasonic cleaning at room temperature. As the amount of dissolved gas increases, the degree of cavitation decreases, and thus it is preferable to use a solution with a low amount of dissolved gas.

As the frequency of ultrasonic waves increases, the degree of cavitation decreases, thus the physical force applied to the absorber 121 decreases, but the cavitation density increases, and thus the penetration force may be improved. Therefore, selection of an appropriate frequency is critical. For example, the ultrasonic cleaner 205 may include frequencies in the range of 25 kHz to 60 kHz.

As the surface tension of the liquid L2 decreases, the degree of cavitation decreases, thus the physical force applied to the absorber 121 decreases, but the cavitation density increases, and thus the penetration force may be improved. Because the surface tension of acetone or ethanol is less than that of water, the degree of cavitation may be low, but the penetration force may be improved. The surface tension may be adjusted by mixing water with acetone or ethanol.

Figure 15:
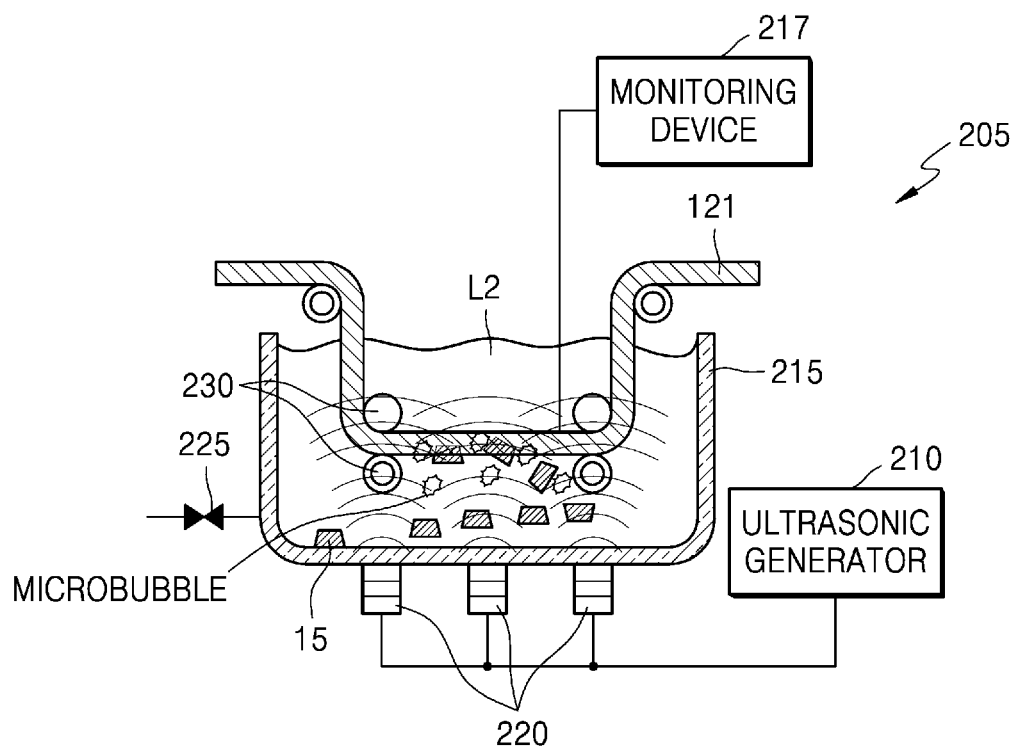

According to another example illustrated in FIG. 15, the ultrasonic cleaner 205 is different from that illustrated in FIG. 14 in that the absorber 121 is movably supported in a roll-to-roll structure. The absorber 121 may be supported by a plurality of rollers 230, and an area from which the micro-semiconductor chips 15 are to be collected may be limited by the rollers 230 to be positioned in the liquid L2. The plurality of rollers 230 may include a pair of rollers arranged outside the reservoir 215, and two pairs of rollers for allowing a chip extraction area of the absorber 121 to be in the reservoir 215. While a chip extraction process is not performed, the rollers 230 may be positioned not to be in contact with the absorber 121. After scanning, when the absorber 121 used for the scanning is moved and positioned at the center of the reservoir 215, the rollers 230 may press the absorber 121 to be fixed. Then, the rollers 230 may be moved such that the absorber 121 is immersed in the liquid L2 in the reservoir 215. Then, the micro-semiconductor chips 15 may be separated from the absorber 121 by cavitation caused by using the ultrasonic transducers 220. After extraction of the micro-semiconductor chips 15, a monitoring device 217 may detect whether the micro-semiconductor chips 15 remain in the absorber 121. When the micro-semiconductor chips 15 remain in the absorber 121 according to a result of detection, the ultrasonic cleaning operation described above may be repeated.

Figure 16:
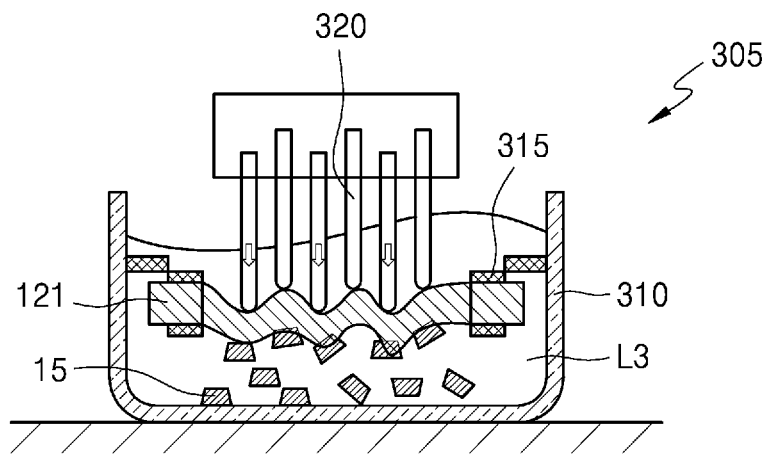
FIGS. 16 and 17 illustrate examples in which a chip extraction module of a micro-semiconductor chip transfer apparatus includes a vibration cleaner, according to example embodiments.
Figure 17:
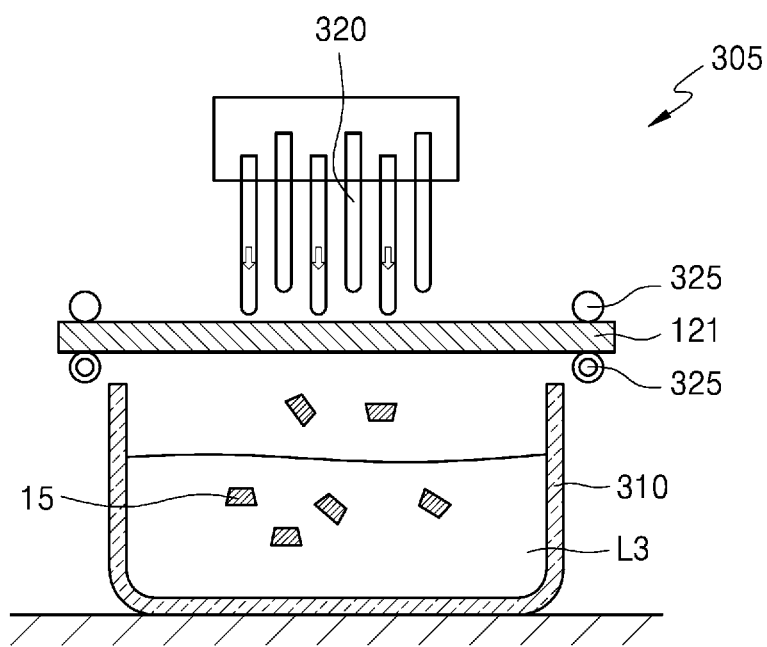

FIGS. 16 and 17 illustrate examples in which a chip extraction module includes a vibration cleaner 305. Referring to FIG. 16, the vibration cleaner 305 may include a reservoir 310 accommodating liquid L3, holders 315 provided on the inner wall of the reservoir 310 for holding the absorber 121, and the vibrators 320 for vibrating the absorber 121. The vibrators 320 may be in contact with the absorber 121 to directly apply vibration, thereby causing the micro-semiconductor chips 15 to be separated from the absorber 121. The vibrators 320 may be configured such that a plurality of rods intersect with each other to vibrate the absorber 121. Although FIG. 16 illustrates an example in which the vibrators 320 includes the plurality of rods, the vibrators 320 may include a single rod, which may scan the surface of the absorber 121 while applying vibration thereto to extract the micro-semiconductor chips 15. The frequency of vibration applied by the vibrators 320 may be in an ultrasonic band.

Compared to the absorber 121 illustrated in FIG. 16, referring to FIG. 17, the absorber 121 may be supported by a plurality of rollers 325, and may be positioned outside the reservoir 310. In addition, the vibration cleaner 320 may be positioned above the absorber 121 and vibrate the absorber 121 to extract the micro-semiconductor chips 15.

Figure 18A:
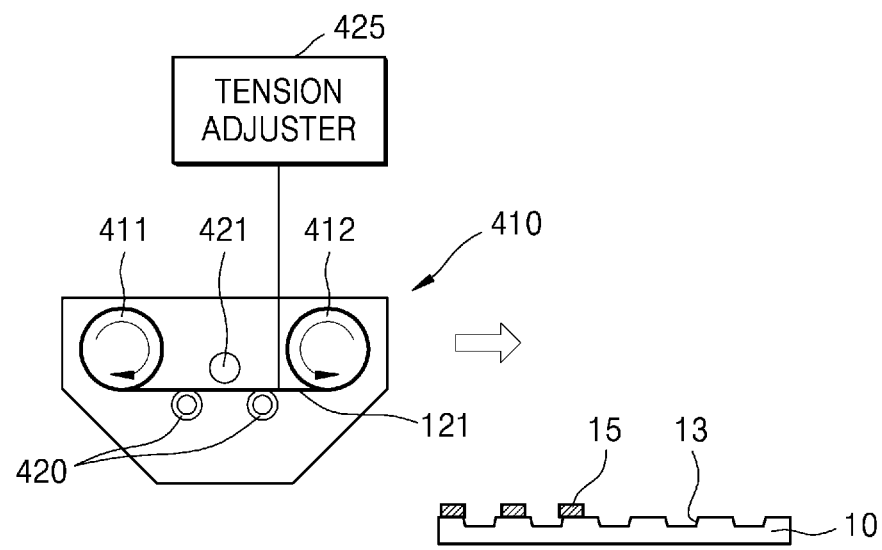
FIGS. 18A, 18B, and 18C illustrate an example in which a chip alignment module of a micro-semiconductor chip transfer apparatus employs a roll-to-roll scheme, according to an example embodiment.
Figure 18B:
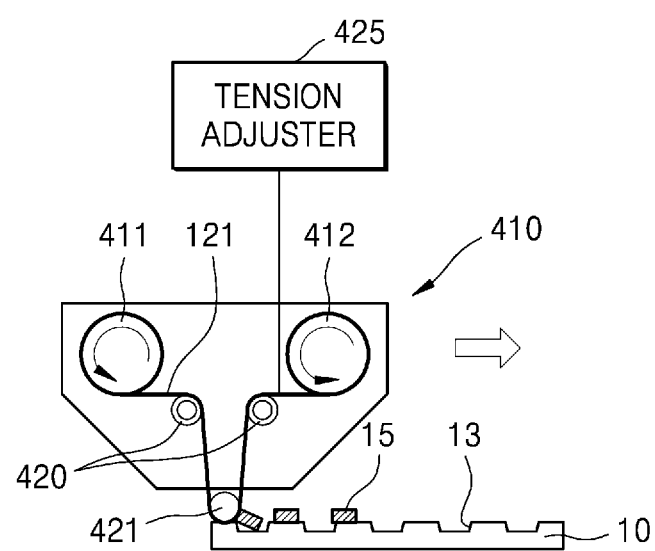
Figure 18C:
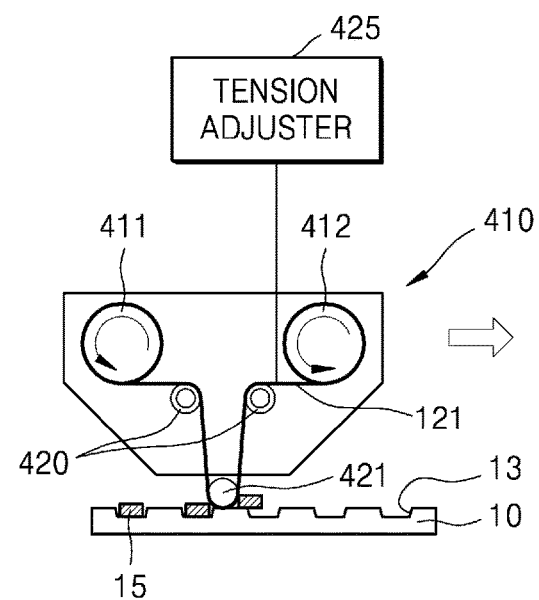

FIGS. 18A, 18B, and 18C illustrate an example of a chip alignment module 410 of a roll-driven type.

The chip alignment module 410 may include a supply roller 411, a recovery roller 412 spaced apart from the supply roller 411, the absorber 121 positioned between the supply roller 411 and the recovery roller 412 and the absorber 121 wound around the supply roller 411 and the recovery roller 412, transfer rollers 420 arranged below the absorber 121, and a pressing roller 421 arranged above the absorber 121. The chip alignment module 410 may move toward the transfer substrate 10. The micro-semiconductor chip transfer apparatus 100 may be configured by using a roll-to-roll-type absorber transfer apparatus.

In an initial state, the chip alignment module 410 may be spaced apart from the transfer substrate 10, and the pressing roller 421 may be positioned above the absorber 121 not to be in contact with the absorber 121.

FIG. 18B illustrates a state in which the chip alignment module 410 reaches the front end of the transfer substrate 10. The pressing roller 421 of the chip alignment module 410 may move to cause the absorber 121 to be in contact with the transfer substrate 10. At this time, the supply roller 411 may perform an unwinding operation and the recovery roller 412 may perform a winding operation such that the absorber 121 droops with a constant tension. The pressing roller 421 may allow the absorber 121 to maintain force required for wet alignment.

Referring to FIG. 18C, as the pressing roller 421 moves while pressing the transfer substrate 10, the absorber 121 wound around the pressing roller 421 may move in contact with the transfer substrate 10. The chip alignment module 410 may repeatedly perform scanning in a scanning area to align the micro-semiconductor chips 15 in the grooves 13 of the transfer substrate 10. In the chip alignment process, the supply roller 411 may unwind the absorber 121 while the recovery roller 412 may wind the absorber 121 such that the contact area of the absorber 121 with the transfer substrate 10 shifts while scanning the transfer substrate 10. In this way, the micro-semiconductor chips 15 may be aligned in the grooves 13 of the transfer substrate 10. After the chip alignment process is finished, in order to return to the initial state, the pressing roller 421 moves upward to reach its initial position, and simultaneously, the supply roller 411 and the recovery roller 412 performs a winding operation to tighten the absorber 121. The cleaning module 130 may be configured in the same manner as described above to remove the micro-semiconductor chips 15 remaining on the transfer substrate 10. The chip alignment module 410 may further include a tension adjuster 425 for adjusting the tension of the absorber 121.

Figure 19A:
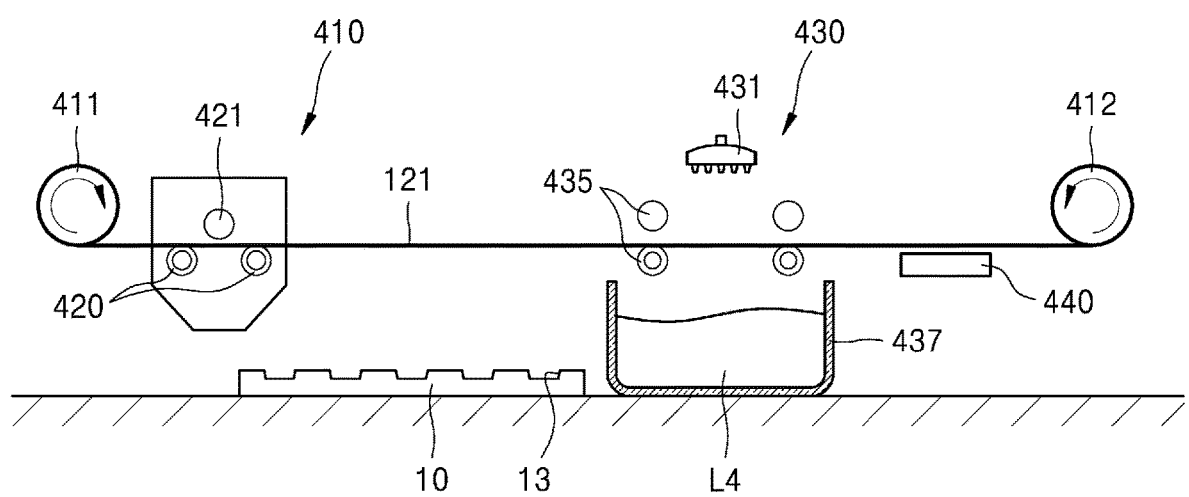
FIGS. 19A, 19B, and 19C illustrate an example in which a chip alignment module and a chip extraction module of a micro-semiconductor chip transfer apparatus employ a roll-to-roll scheme, according to an example embodiment.
Figure 19B:
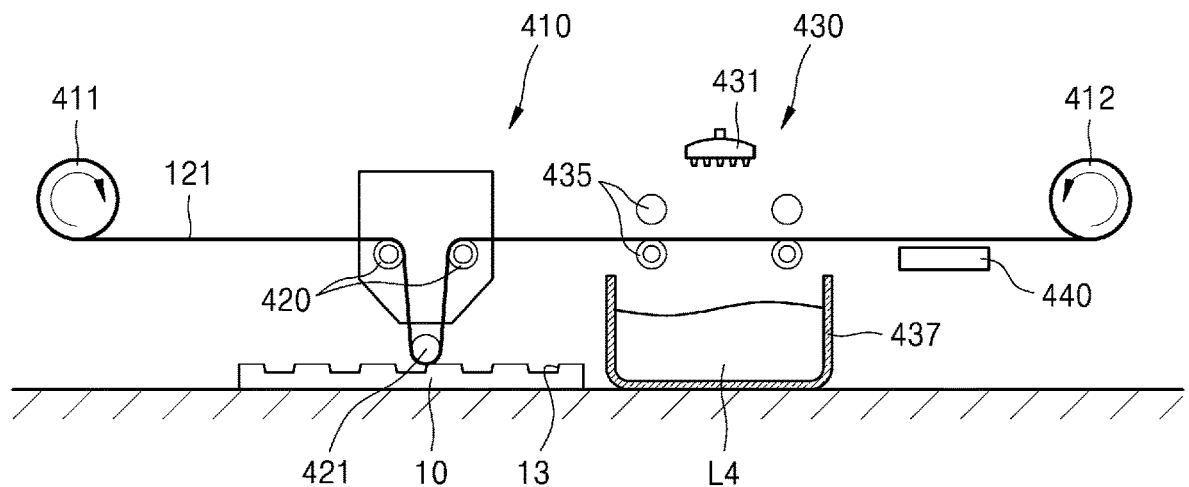
Figure 19C:
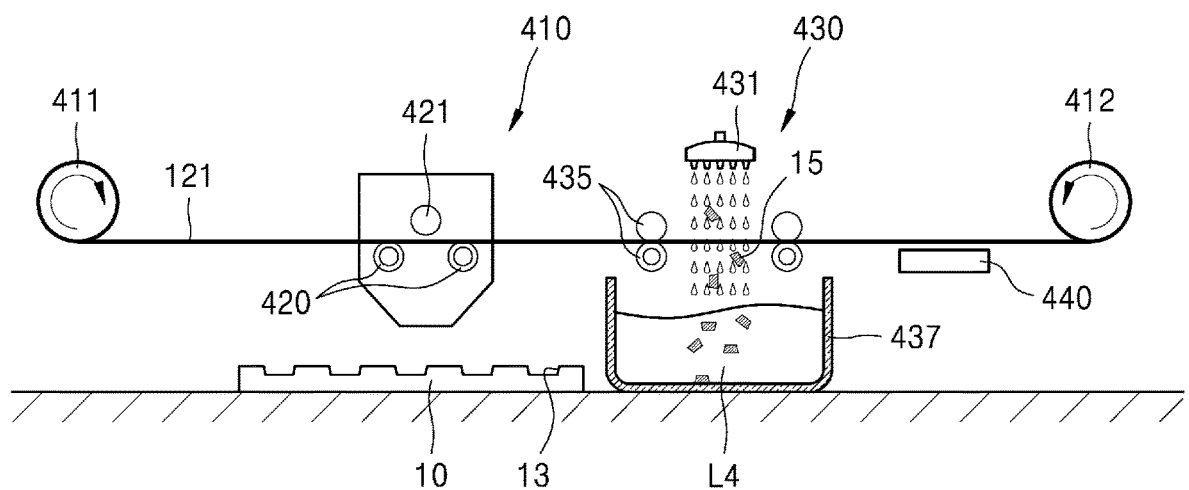

FIGS. 19A, 19B, and 19C illustrate an example in which the chip alignment module 410 and a chip extraction module 430 are arranged adjacent to each other, and the absorber 121 is configured to be continuously move from the chip alignment module 410 to the chip extraction module 430. According to an example embodiment, the chip extraction module 430 may be the chip extraction module 151 illustrated in FIGS. 1 and 9-17 described above.

The chip alignment module 410 in this example is substantially the same as that described with reference to FIGS. 18A, 18B, and 18C, and thus a detailed description thereof will be omitted.

The chip extraction module 430 may include a liquid spray cleaner 431, rollers 435 arranged above and below the absorber 121, and a reservoir 437 for accommodating liquid L4 and arranged below the liquid spray cleaner 431. The chip alignment module 410 and the chip extraction module 430 are arranged adjacent to each other between the supply roller 411 and the recovery roller 412, and the absorber 121 is supported to be movable from the supply roller 411 to the recovery roller 412.

Referring to FIG. 19B, the chip alignment module 410 may move, and the absorber 121 may be brought in contact with the transfer substrate 10 by the pressing roller 421, and thus scan the transfer substrate 10. In addition, referring to FIG. 19C, after the chip alignment module 410 completely scans the transfer substrate 10 and reaches the end thereof, the pressing roller 421 may stop pressing the absorber 121. Then, when the absorber 121 to which the remaining micro-semiconductor chips 15 adhere moves toward the chip extraction module 430 and is then positioned below the liquid spray cleaner 431, the liquid L4 may be sprayed from the liquid spray cleaner 431 to extract the micro-semiconductor chips 15. The extracted micro-semiconductor chips 15 may be collected in the reservoir 437. A heater 440 may be further provided outside the reservoir 437. The heater 440 may be arranged between the chip extraction module 430 and the recovery roller 412. The heater 440 may dry the absorber 121 wet by sprayed liquid.

As described above, in the roll-to-roll structure, the whole process may be performed while the absorber 121 continuously moves from the chip alignment module 410 to the chip extraction module 430, and accordingly, the time taken for the process may be reduced and the productivity may increase. Although FIGS. 19A, 19B, and 19C illustrate an example in which the liquid spray cleaner 431 is employed for the chip extraction module 430, the roll-driven ultrasonic cleaner illustrated in FIG. 15 or the roll-driven vibration cleaner 320 illustrated in FIG. 17 may be provided instead of the liquid spray cleaner 431.

Figure 20:
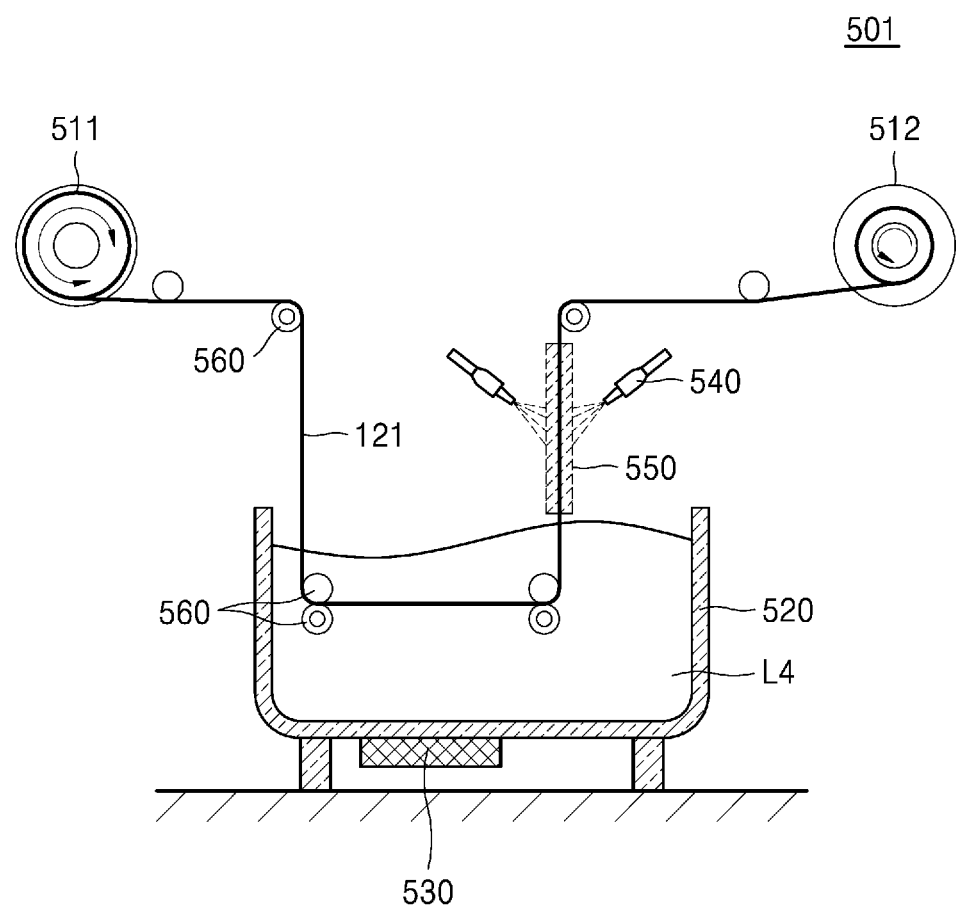
FIG. 20 illustrates an example in which a chip extraction module of a micro-semiconductor chip transfer apparatus includes an ultrasonic cleaner and a liquid spray cleaner, according to an example embodiment.

FIG. 20 illustrates an example of a combined chip extraction module according to an example embodiment.

According to an example embodiment, a combined chip extraction module 501 may include a reservoir 520 accommodating the liquid L4, and the absorber 121 is positioned between a supply roller 511 and a recovery roller 512 and wound therearound, and is supported by a plurality of rollers 560 between the supply roller 511 and the recovery roller 512. In addition, the rollers 560 may limit the position of the absorber 121 to pass through the liquid L4. An ultrasonic cleaner 530 may be provided below the reservoir 520, and a liquid spray cleaner 540 may be provided adjacent to a portion of the absorber 121 positioned outside the reservoir 520. According to an example embodiment, the combined chip extraction module 501 is implemented with a combination of the ultrasonic cleaner 530 and the liquid spray cleaner 540. The micro-semiconductor chips 15 adhered to the absorber 121 may be primarily extracted by ultrasonic waves generated by the ultrasonic cleaner 530, then the liquid spray cleaner 540 may spray a liquid onto the absorber 121, and consequently, the remaining micro-semiconductor chips 15 may be secondarily extracted. Furthermore, the chip extraction module may be implemented with a combination of the ultrasonic cleaner 530 and the vibration cleaner 305 (see FIG. 16) or a combination of the vibration cleaner 305 and the liquid spray cleaner 540. A clamper 550 may be further provided to tightly hold the portion of the absorber 121 positioned outside the reservoir 520.

Figure 21:
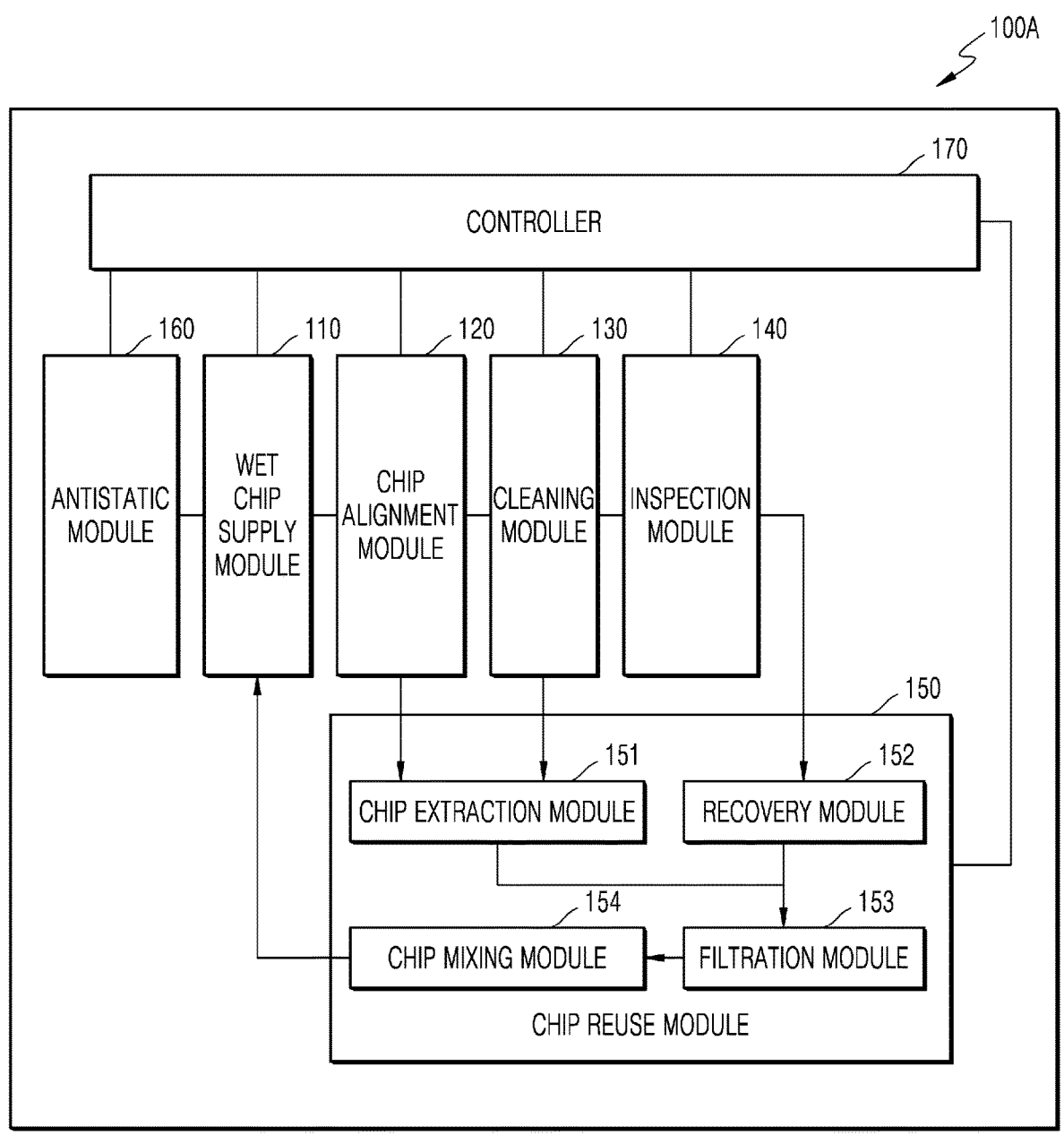
FIG. 21 is a block diagram of a micro-semiconductor chip transfer apparatus according to another example embodiment.

FIG. 21 is a block diagram of a micro-semiconductor chip transfer apparatus 100A according to another example embodiment.

The chip reuse module 150 of the micro-semiconductor chip transfer apparatus 100A may further include a recovery module 152, a filtration module 153, and a chip mixing module 154.

Figure 22:
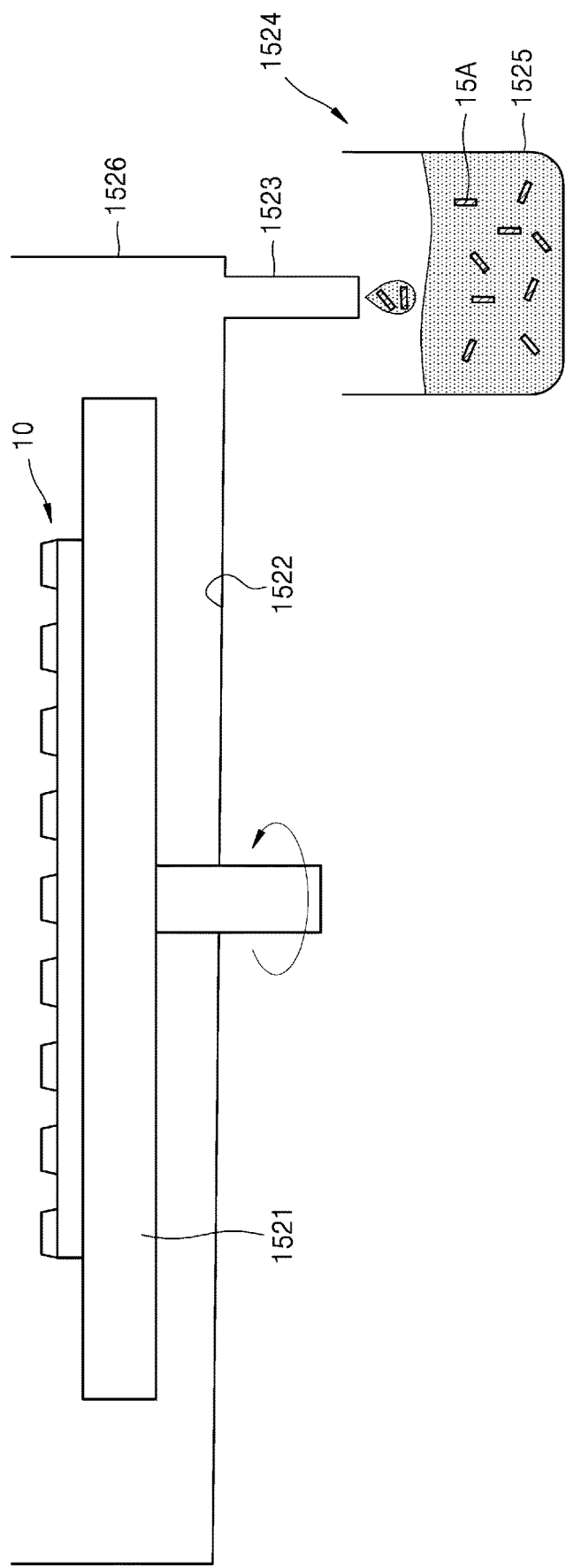
FIG. 22 illustrates an example of a recovery module illustrated in FIG. 21.

FIG. 22 illustrates an example of a recovery module 1524 according to an example embodiment. The recovery module 1524 may recover dummy micro-semiconductor chips 15A. The transfer substrate 10 may be supported by a rotatable substrate support 1521. The substrate support 1521 may be rotatably coupled to a case 1526. However, the support structure and operation of the substrate support 1521 are not limited thereto, and may be variously modified. The substrate support 1521 may support the transfer substrate 10 not to be unintentionally moved while the absorber 121 and the transfer substrate 10 move relatively to each other. The substrate support 1521 may adsorb and support the lower surface of the transfer substrate 10.

The recovery module 1524 may include an accommodation unit 1525 for accommodating the dummy micro-semiconductor chips 15A separated from the transfer substrate 10. The dummy micro-semiconductor chips 15A accommodated in the accommodation unit 1525 may be reused. The recovery module 1524 may have a structure in which a liquid flows on a bottom surface 1522 of the case 1526 toward the accommodation unit 1525 such that the dummy micro-semiconductor chips 15A are transferred to the accommodation unit 1525. The bottom surface 1522 may be downwardly inclined toward a drain hole 1523. When the dummy micro-semiconductor chips 15A remaining after a transfer process onto the transfer substrate 10 are dropped on the bottom surface 1525 of the case 1526, and the liquid is caused to flow in the case 1526, the dummy micro-semiconductor chips 15A may be recovered to the accommodation unit 1525 through the drain hole 1523.

Figure 23:
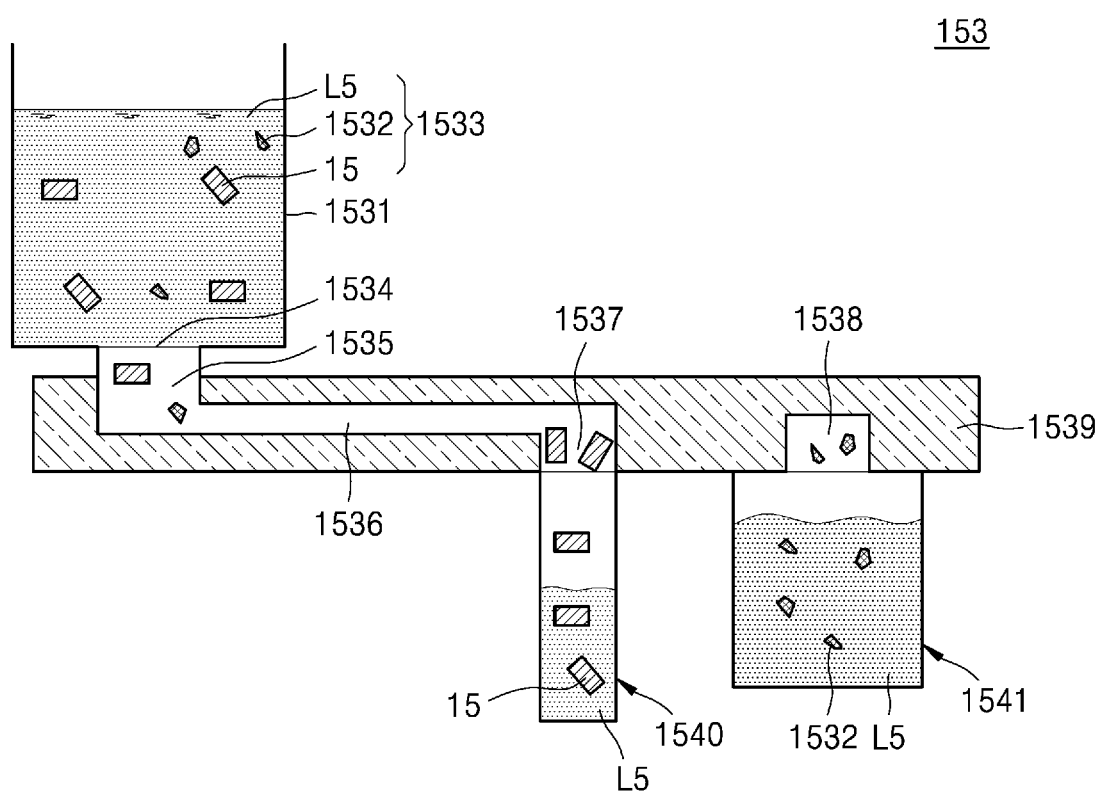
FIG. 23 illustrates an example of a filtration module illustrated in FIG. 21.

FIG. 23 illustrates an example of the filtration module 153 according to an example embodiment.

The micro-semiconductor chips 15 recovered from at least one of the chip extraction module 151 and the recovery module 152 may be accommodated in a reservoir 1531. The reservoir 1531 may be substituted with the reservoir 1512 (FIG. 9), 215 (FIG. 14), 310 (FIG. 16), 437 (FIG. 19A), or 520 (FIG. 20) of the chip extraction module described above. Alternatively, the reservoir 1531 may be substituted with the accommodation unit 1525 of the recovery module 1524 described with reference to FIG. 22. The reservoir 1531 is filled with liquid L5 in which the micro-semiconductor chips 15 are immersed. Impurities 1532 may also be accommodated in the reservoir 1531. The liquid L5, the micro-semiconductor chips 15, and the impurities 1532 may constitute a suspension 1533. The filtration module 153 may remove the impurities 1532 from the suspension 1533 and collect only the micro-semiconductor chips 15.

In the suspension 1533 stored in the reservoir 1531, the specific gravity of the micro-semiconductor chip 15 may be greater than that of the liquid L5. The specific gravity of the micro-semiconductor chip 15 may be two times or greater, for example, four times or greater, or six times or greater the specific gravity of the liquid L5. The specific gravity of the micro-semiconductor chip 15 may be less than or equal to 40 times the specific gravity of the liquid L5.

For example, the impurities 1532 may include materials other than the micro-semiconductor chips 15, which are collected together with the micro-semiconductor chips 15. As another example, the impurities 1532 may include fragments broken off from the micro-semiconductor chips 15 due to collision therebetween. Accordingly, the impurities 1532 may include materials, at least one of the size and mass of which is different from those of the micro-semiconductor chip 15, and may include materials different from that of the micro-semiconductor chip 15, and portions of the micro-semiconductor chips 15, e.g., fragments broken off from the micro-semiconductor chips 15.

The filtration module 153 may receive the suspension 1533 introduced from the reservoir 1531, separate a first suspension containing the micro-semiconductor chips 15 and a second suspension containing the impurities 1532 from the suspension 1533, and provide only the first suspension to the chip mixing module 154. The chip mixing module 154 may gather the collected micro-semiconductor chips 15 and supply them to the wet chip supply module 110 to be reused.

The filtration module 153 may include a substrate 1539, an inlet 1535 through which the suspension 1533 is introduced from the reservoir 1531 to the substrate 1539, a channel 1536 through which the suspension 1533 flows, and a first outlet 1537 through which the first suspension containing the micro-semiconductor chips 15 is discharged to a first reservoir 1540. The filtration module 153 may further include a second outlet 1538 through which the second suspension containing the impurities 1532 is discharged.

The inlet 1535 may be connected to an outlet 1534 of the reservoir 1531, and the first outlet 1537 may be connected to an upper region of the first reservoir 1540. A difference in pressure allows the suspension 1533 to naturally pass through the channel 1536. The second outlet 1538 may be connected to a second reservoir 1541. The second outlet 1538 may be connected to an upper region of the second reservoir 1541 such that the second suspension naturally flows by pressure to be accommodated in the second reservoir 1541.

The sizes of the inlet 1535, the channel 1536, and the first and second outlets 1537 and 1538 may be greater than the size of the micro-semiconductor chip 15. For example, the sizes of the inlet 1535, the channel 1536, and the first and second outlets 1537 and 1538 may be in the range of 100 μm to 1000 μm.

The substrate 1539 may be formed of at least one of silicon, glass, polymer, plastic, and metal, and the channel 1536 may be embedded in the substrate 1539. The filtration module 153 may separate the micro-semiconductor chips 15 from the impurities 1532 by using at least one of a microfluidic scheme, an acoustophoretic scheme, a dielectrophoretic scheme, a magnetophoretic scheme, a centrifugal scheme, and a pinched flow fractionation scheme.

As another example, the filtration module 153 may include a mesh filter. When the micro-semiconductor chip 15 has a size less than those of the impurities 1532, the holes of the mesh filter may be formed to be larger than the micro-semiconductor chip 15 and smaller than the impurities 1532. Accordingly, the impurities 1532, the greatest cross-sectional dimension of which is greater than the hole diameter of the mesh filter, may be filtered out. For example, when the cross-sectional dimension of the micro-semiconductor chip 15 is 40 μm, the hole diameter of the mesh filter may be 50 μm or greater.

Alternatively, when the micro-semiconductor chip 15 has a size greater than those of the impurities 1532, the holes of the mesh filter may be formed to be smaller than the micro-semiconductor chip 15 and larger than the impurities 1532. For example, when the cross-sectional dimension of the micro-semiconductor chip 15 is 40 μm, the hole diameter of the mesh filter may be 30 μm or less. Small impurities having passed through the mesh filter may be removed, and high-quality micro-semiconductor chips filtered out by the mesh filter may be collected by performing back-flushing.

Alternatively, the filtration module 153 may include a microfluidic filter to separate impurities from a continuous flow of fluid. The microfluidic filter may be configured in a passive manner of controlling fine particles in fluid by using the hydrodynamic properties of microfluidic channels, or in an active manner of controlling fine particles in a microfluidic channel by using force applied from the outside of the microfluidic channel.

Referring back to FIG. 21, the chip mixing module 154 may produce, as necessary, a liquid for use in transfer, from a liquid containing micro-semiconductor chips and from which impurities are filtered out by the filtration module 153. At this time, the chip mixing module 154 may adjust the amount of the liquid to allow the suspension being prepared by the wet chip supply module 110 to contain an appropriate quantity of chips.

Figure 24:
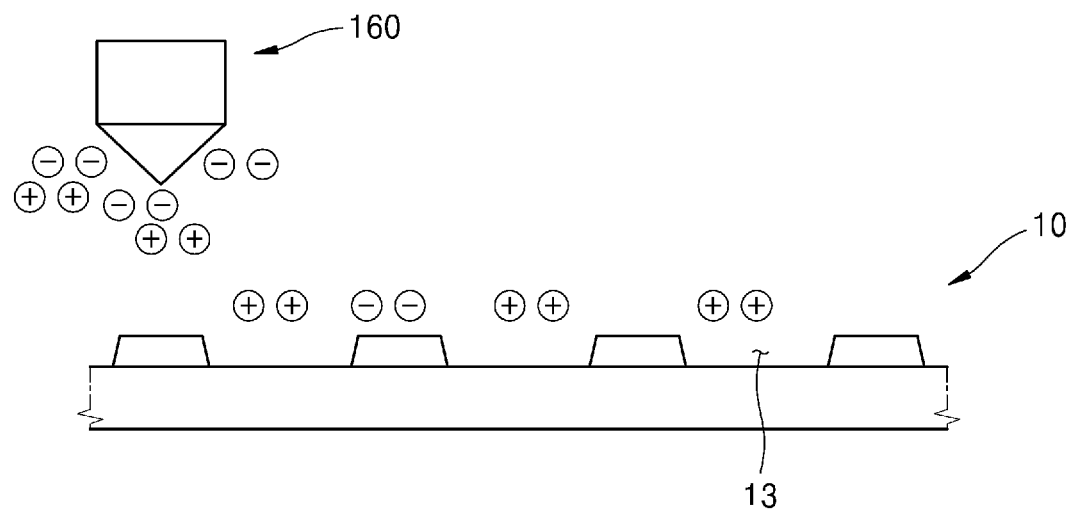
FIGS. 24 and 25 illustrate examples of an antistatic module illustrated in FIG. 21.

FIG. 24 illustrates an example of an antistatic module 160 included in the micro-semiconductor chip transfer apparatus. The antistatic module 10 may supply ions onto the transfer substrate 10 to remove static electricity from the transfer substrate 10.

The plurality of micro-semiconductor chips 15 are significantly small in size, and accordingly, even weak static electricity may cause them to be damaged or unintentionally moved. Considering this issue, the antistatic module 160 may supply ions for preventing an occurrence of static electricity, to the transfer substrate 10 or the plurality of micro-semiconductor chips 15.

Figure 25:
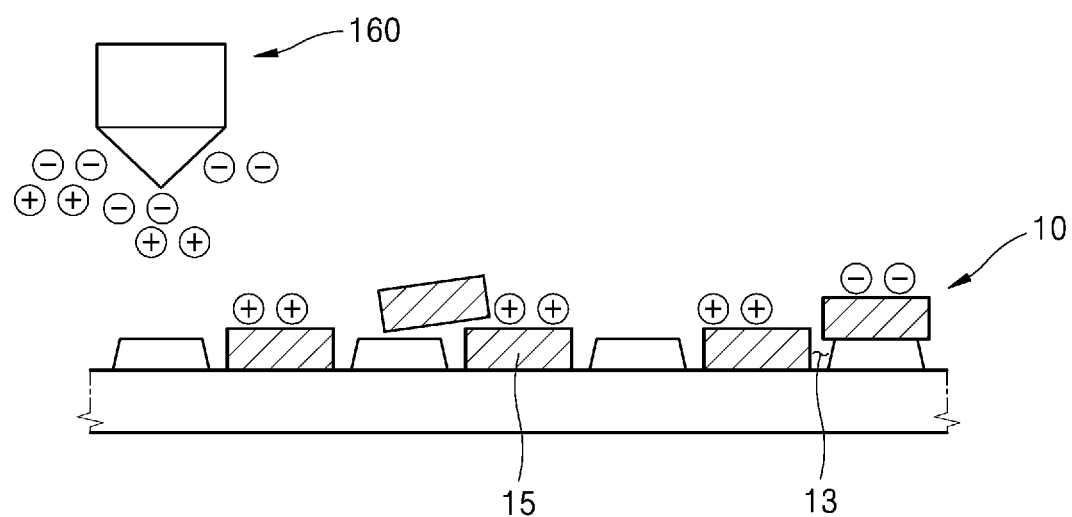

The antistatic module 160 may supply ions for preventing an occurrence of static electricity to the transfer substrate 10 before the plurality of micro-semiconductor chips 15 are supplied onto the transfer substrate 10. As another example, referring to FIG. 25, the antistatic module 160 may supply ions for preventing an occurrence of static electricity after the plurality of micro-semiconductor chips 15 are supplied onto the transfer substrate 10 and their alignment progresses to some extent.

Figure 26:
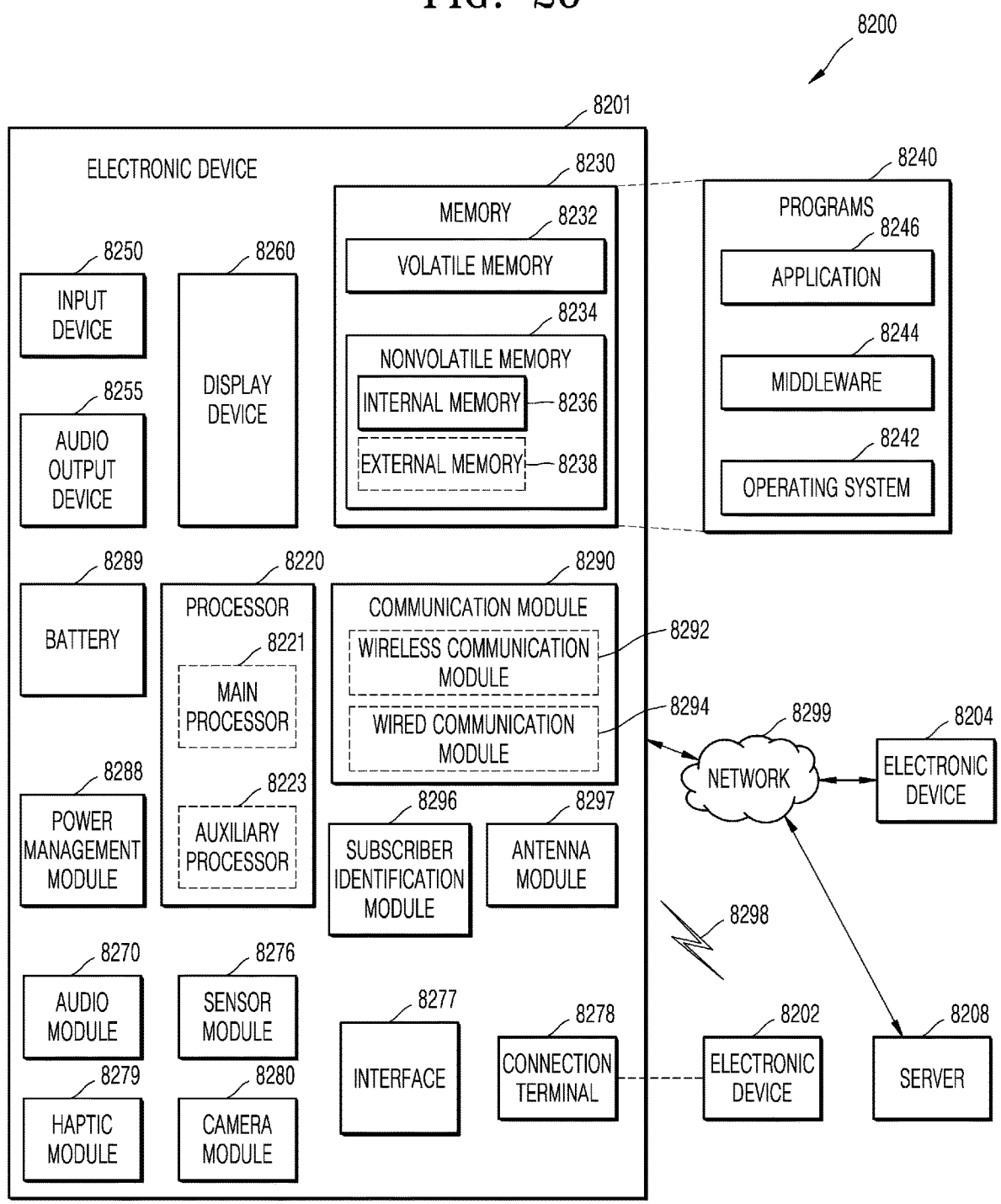
FIG. 26 is a schematic block diagram of an electronic device according to an example embodiment.

FIG. 26 is a block diagram of an electronic device 8201 including a display device manufactured by transferring micro-semiconductor chips.

Referring to FIG. 26, the electronic device 8201 may be provided in a network environment 8200. In the network environment 8200, the electronic device 8201 may communicate with another electronic device 8202 through a first network 8298 (e.g., a short-range wireless communication network, etc.) or communicate with another electronic device 8204 and/or a server 8208 through a second network 8299 (e.g., a long-range wireless communication network, etc.). The electronic device 8201 may communicate with the electronic device 8204 through the server 8208. The electronic device 8201 may include a processor 8220, a memory 8230, an input device 8250, an audio output device 8255, a display device 8260, an audio module 8270, a sensor module 8276, an interface 8277, a haptic module 8279, the camera module 8280, a power management module 8288, a battery 8289, a communication module 8290, a subscriber identification module 8296, and/or an antenna module 8297. Some of these components may be omitted or other components may be additionally included in the electronic device 8201. Some of these components may be implemented in one integrated circuit. For example, the sensor module 8276 (e.g., a fingerprint sensor, an iris sensor, an illuminance sensor, etc.) may be embedded in the display device 8260 (e.g., a display, etc.) to be implemented.

The processor 8220 may execute software (e.g., programs 8240, etc.) to control one or more other components (e.g., hardware, software components, etc.) of the electronic device 8201 connected to the processor 8220, and may perform a variety of data processing or operations. As part of the data processing or operations, the processor 8220 may load commands and/or data received from other components (e.g., the sensor module 8276, the communication module 8290, etc.) into a volatile memory 8232, process the commands and/or data stored in the volatile memory 8232, and store result data in a nonvolatile memory 8234. The nonvolatile memory 8234 may include an internal memory 8236 and an external memory 8238. The processor 8220 may include a main processor 8221 (e.g., a central processing unit, an application processor, etc.) and an auxiliary processor 8223 (e.g., a graphics processing unit, an image signal processor, a sensor hub processor, a communication processor, etc.) that may operate independently of or together with the main processor 8221. The auxiliary processor 8223 may consume less power than the main processor 8221, and may perform a specialized function.

The auxiliary processor 8223 may control functions and/or states related to some components (e.g., the display device 8260, the sensor module 8276, the communication module 8290, etc.) of the electronic device 8201, on behalf of the main processor 8221 while the main processor 8221 is in an inactive (e.g., sleep) state, or with the main processor 8221 while the main processor 8221 is in an active (e.g., application execution) state. The auxiliary processor 8223 (e.g., an image signal processor, a communication processor, etc.) may be implemented as part of other functionally relevant components (e.g., the camera module 8280, the communication module 8290, etc.).

The memory 8230 may store a variety of data required by components (e.g., the processor 8220, the sensor module 8276, etc.) of the electronic device 8201. The data may include, for example, software (e.g., the programs 8240, etc.) and input data and/or output data for commands related thereto. The memory 8230 may include the volatile memory 8232 and/or the nonvolatile memory 8234.

The programs 8240 may be stored as software in the memory 8230, and may include an operating system 8242, middleware 8244, and/or an application 8246.

The input device 8250 may receive commands and/or data to be used for the components (e.g., the processor 8220, etc.) of the electronic device 8201 from the outside (e.g., a user, etc.) of the electronic device 8201. The input device 8250 may include a remote controller, a microphone, a mouse, a keyboard, and/or a digital pen (e.g., a stylus pen, etc.).

The audio output device 8255 may output an audio signal to the outside of the electronic device 8201. The audio output device 8255 may include a speaker and/or a receiver. The speaker may be used for general purposes such as multimedia playback or recording playback, and the receiver may be used to receive an incoming call. The receiver may be combined as part of the speaker or may be implemented as an independent separate device.

The display device 8260 may visually provide information to the outside of the electronic device 8201. The display device 8260 may include a display, a hologram device, or a projector, and a control circuit for controlling the same. The display device 8260 may include a display device manufactured by using the micro-semiconductor chip transfer apparatus described with reference to FIGS. 1 to 25. The display device 8260 may include a touch circuitry configured to detect a touch, and/or a sensor circuitry (e.g., a pressure sensor) configured to measure the strength of force generated by the touch.

The audio module 8270 may convert a sound into an electrical signal or vice versa. The audio module 8270 may obtain a sound through the input device 8250 or may output the sound through the audio output device 8255 and/or a speaker and/or headphones of another electronic device (e.g., the electronic device 8202, etc.) directly or wirelessly connected to the electronic device 8201.

The sensor module 8276 may detect an operating state (e.g., power, temperature, etc.) of the electronic device 8201 or an external environment state (e.g., a user state, etc.), and may generate an electrical signal and/or a data value corresponding to the detected state. The sensor module 8276 may include a gesture sensor, a gyro sensor, a barometric sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more designated protocols, which may be used to directly or wirelessly connect the electronic device 8201 to another electronic device (e.g., the electronic device 8202, etc.). The interface 8277 may include a high-definition multimedia interface (HDMI), a universal serial bus (USB) interface, a secure digital (SD) card interface, and/or an audio interface.

A connection terminal 1878 may include a connector through which the electronic device 8201 may be physically connected to another electronic device (e.g., the electronic device 8202, etc.). The connection terminal 8278 may include an HDMI connector, a USB connector, an SD card connector, and/or an audio connector (e.g., a headphone connector, etc.).

The haptic module 8279 may convert an electrical signal into a mechanical stimulus (e.g., vibration, movement, etc.) or an electrical stimulus that a user may perceive through a tactile or motor sensations. The haptic module 8279 may include a motor, a piezoelectric element, and/or an electrical stimulation device.

The camera module 8280 may capture a still image or a moving image. The camera module 8280 may include a lens assembly including one or more lenses, image sensors, image signal processors, and/or flashes. The lens assembly included in the camera module 8280 may collect light emitted from an object to be image-captured.

The power management module 8288 may manage power supplied to the electronic device 8201. The power management module 8288 may be implemented as part of a power management integrated circuit (PMIC).

The battery 8289 may supply power to components of the electronic device 8201. The battery 8289 may include a non-rechargeable primary cell, a rechargeable secondary cell, and/or a fuel cell.

The communication module 8290 may support establishment of a direct (wired) communication channel and/or a wireless communication channel between the electronic device 8201 and other electronic devices (e.g., the electronic devices 8202 and 8204, the server 8208, etc.), and communication through the established communication channel. The communication module 8290 may operate independently of the processor 8220 (e.g., an application processor, etc.), and may include one or more communication processors for supporting direct communication and/or wireless communication. The communication module 8290 may include a wireless communication module 8292 (e.g., a cellular communication module, a short-range wireless communication module, a global navigation satellite system (GNSS) communication module, etc.) and/or a wired communication module 8294 (e.g., a local area network (LAN) communication module, a power line communication module, etc.). The corresponding communication module among these communication modules may communicate with other electronic devices through the first network 8298 (e.g., a short-range communication network such as Bluetooth, Wi-Fi Direct, or Infrared Data Association (IrDA)) or the second network 8299 (e.g., a long-range communication network such as a cellular network, the Internet, or a computer network (a LAN, a wide area network (WAN))). These various types of communication modules may be integrated into a single component (e.g., a single chip, etc.) or may be implemented as a plurality of separate components (e.g., a plurality of chips). The wireless communication module 8292 may identify and authenticate the electronic device 8201 within a communication network such as the first network 8298 and/or the second network 8299 by using subscriber information (e.g., an international mobile subscriber identifier (IMSI), etc.) stored in the subscriber identification module 8296.

The antenna module 8297 may transmit or receive a signal and/or power to or from the outside (e.g., other electronic devices, etc.). An antenna may include a radiator made of a conductive pattern formed on a substrate (e.g., a printed circuit board (PCB), etc.). The antenna module 8297 may include one or more antennas. When a plurality of antennas is included, the communication module 8290 may select an antenna suitable for a communication scheme used in a communication network such as the first network 8298 and/or the second network 8299, from among the plurality of antennas. A signal and/or power may be transmitted or received between the communication module 8290 and other electronic devices through the selected antenna. In addition to the antenna, other components (e.g., a radio-frequency integrated circuit (RFIC), etc.) may be included as part of the antenna module 8297.

Some of the components may be connected to each other and exchange signals (e.g., commands, data, etc.) through a communication method between peripheral devices (e.g., a bus, a general-purpose input and output (GPIO), a serial peripheral interface (SPI), a mobile industry processor interface (MIPI), etc.).

Commands or data may be transmitted or received between the electronic device 8201 and the external electronic device 8204 through the server 8208 connected to the second network 8299. The other electronic devices 8202 and 8204 may be of a type that is the same as or different from the electronic device 8201. All or some of the operations executed by the electronic device 8201 may be executed by one or more of the other electronic devices 8202, 8204, and 8208. For example, when the electronic device 8201 is required to perform a certain function or service, the electronic device 8201 may request one or more other electronic devices to perform some or all of the function or service instead of executing the function or service by itself. The one or more other electronic devices that have received the request may execute an additional function or service related to the request, and may transmit a result of the execution to the electronic device 8201. To this end, cloud computing, distributed computing, and/or client-server computing technologies may be used.

Figure 27:
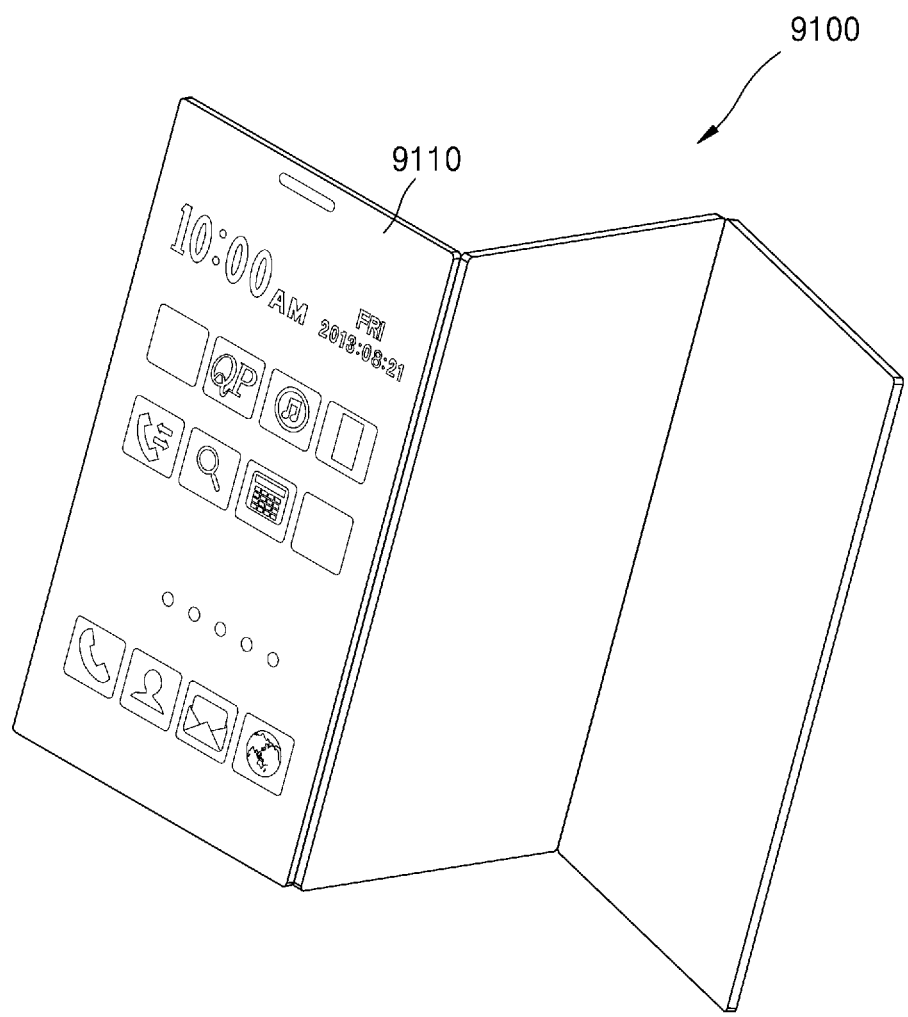
FIG. 27 illustrates an example in which a display device is applied to a mobile device, according to an example embodiment.

FIG. 27 illustrates an example in which an electronic device is applied to a mobile device 9100, according to an example embodiment. The mobile device 9100 may include a display device 9110, which may have a foldable structure, e.g., a multi-foldable structure.

Figure 28:
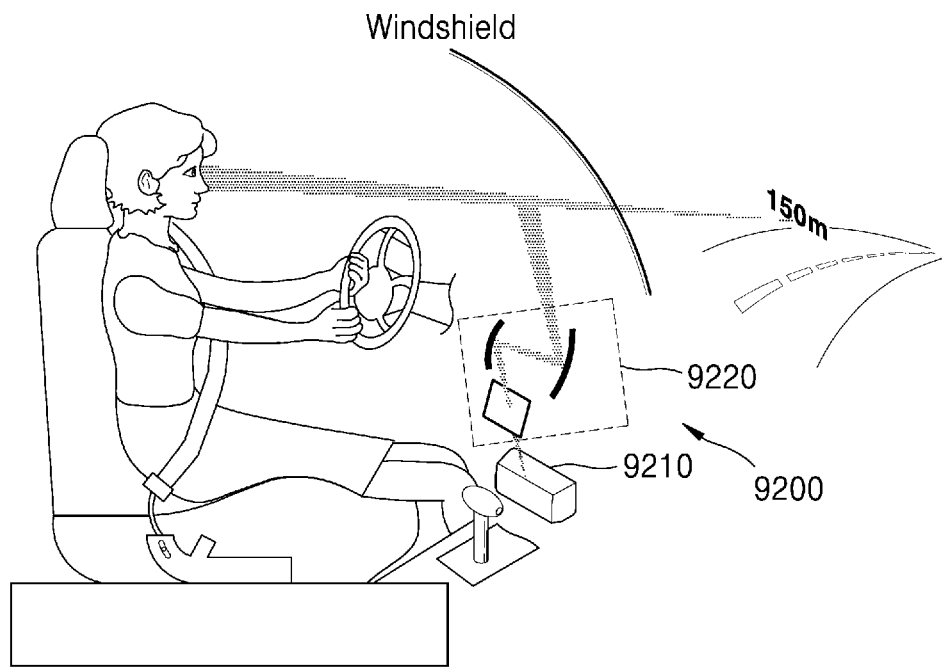
FIG. 28 illustrates an example in which a display device is applied to a vehicle display device, according to an example embodiment.

FIG. 28 illustrates an example in which a display device is applied to a vehicle, according to an example embodiment. The display device may be a vehicle head-up display device 9200, and may include a display 9210 provided at one area of a vehicle, and an optical path changing member 9220 for changing an optical path to allow a driver to view an image generated by the display 9210.

Figure 29:
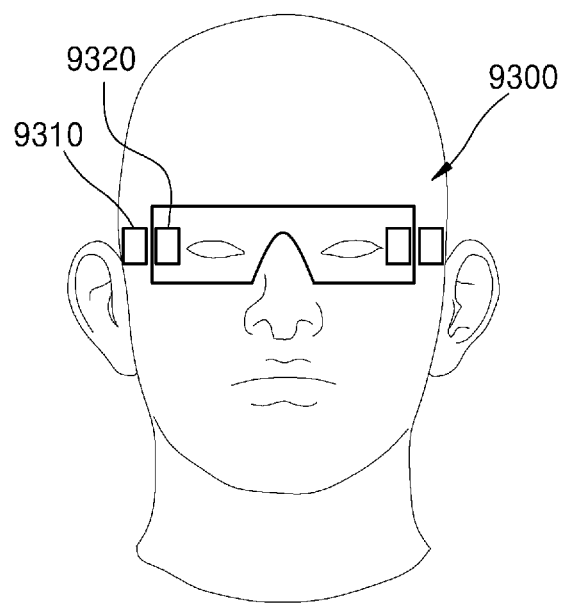
FIG. 29 illustrates an example in which a display device is applied to augmented reality glasses, according to an example embodiment.

FIG. 29 illustrates an example in which a display device is applied to augmented reality glasses or virtual reality glasses 9300, according to an example embodiment. The augmented reality glasses 9300 may include a projection system 9310 configured to form an image, and an element 9320 configured to guide the image from the projection system 9310 to reach an eye of a user.

Figure 30:
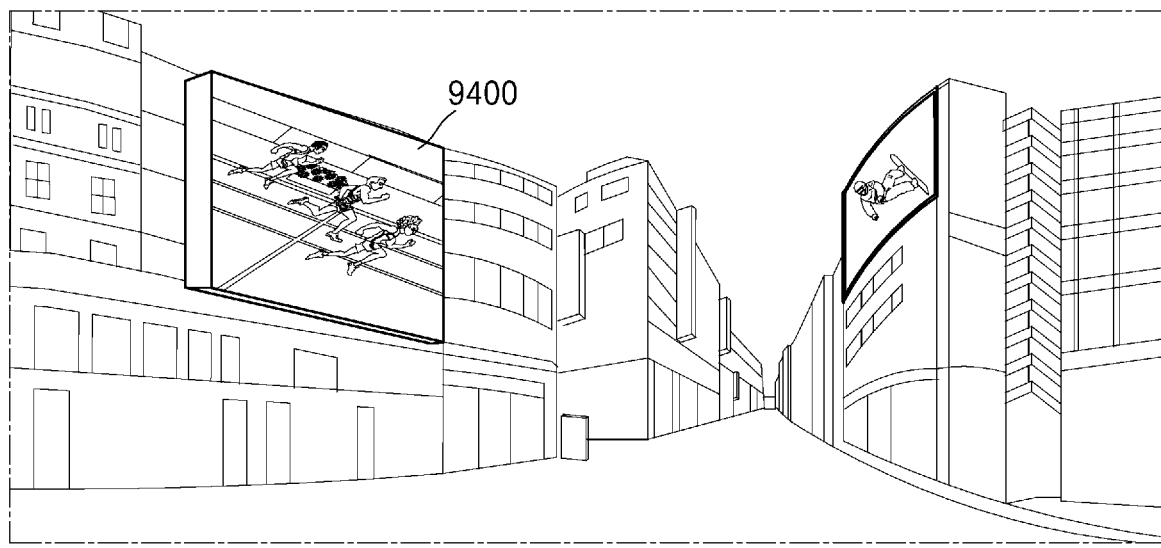
FIG. 30 illustrates an example in which a display device is applied to a signage, according to an example embodiment.

FIG. 30 illustrates an example in which a display device is applied to a large-size signage 9400, according to an example embodiment. The signage 9400 may be used for outdoor advertising using a digital information display, and the content of an advertisement may be controlled through a communication network. The signage 9400 may be implemented, e.g., by using the electronic device 8201 described with reference to FIG. 26.

Figure 31:
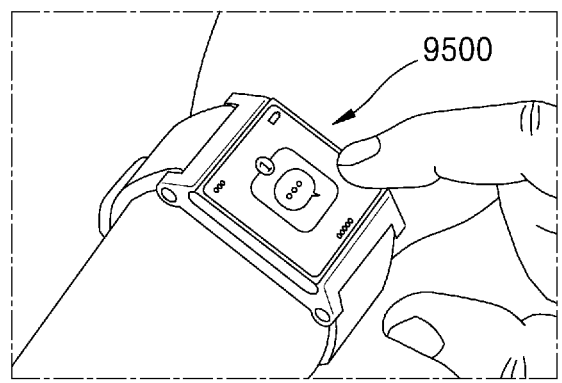
FIG. 31 illustrates an example in which a display device is applied to a wearable display, according to an example embodiment.

FIG. 31 illustrates an example in which a display device is applied to a wearable display 9500, according to an example embodiment. The wearable display 9500 may include a display device manufactured by using the micro-semiconductor chip transfer apparatus according to an example embodiment, and may be implemented by using the electronic device 8201 described with reference to FIG. 26.

The display device according to an example embodiment may be applied to various products such as a rollable television (TV) or a stretchable display.

The micro-semiconductor chip transfer apparatus according to an example embodiment may efficiently transfer micro-semiconductor chips onto a display device by using a fluidic self assembly method. In addition, the micro-semiconductor chip transfer apparatus includes a chip extraction module for extracting micro-semiconductor chips remaining in an absorber after a transfer process to reuse the extracted micro-semiconductor chips, and thus, the amount of waste micro-semiconductor chips may be reduced and production costs may also be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A micro-semiconductor chip transfer apparatus for wet-aligning a plurality of micro-semiconductor chips in a plurality of grooves of a transfer substrate, the micro-semiconductor chip transfer apparatus comprising:

a wet chip supply module configured to supply the plurality of micro-semiconductor chips and a first liquid onto the transfer substrate in a flowable manner;

a chip alignment module comprising an absorber configured to move along a surface of the transfer substrate to align first micro-semiconductor chips, among the plurality of micro-semiconductor chips, respectively in the plurality of grooves and to absorb the first liquid; and a chip extraction module configured to extract, from the absorber, second micro-semiconductor chips, among the plurality of micro-semiconductor chips, which are attached to the absorber.

2. The micro-semiconductor chip transfer apparatus of claim 1, wherein the chip extraction module comprises a liquid spray cleaner configured to spray a second liquid to the absorber to extract the second micro-semiconductor chips from the absorber.

3. The micro-semiconductor chip transfer apparatus of claim 2, wherein the liquid spray cleaner is configured to be rotatable or movable.

4. The micro-semiconductor chip transfer apparatus of claim 1, wherein the chip extraction module comprises a holder configured to fix the absorber.

5. The micro-semiconductor chip transfer apparatus of claim 1, wherein the chip extraction module comprises an ultrasonic cleaner configured to emit ultrasonic waves towards the absorber to extract the second micro-semiconductor chips from the absorber.

6. The micro-semiconductor chip transfer apparatus of claim 1, wherein the chip extraction module comprises a vibration cleaner configured to vibrate the absorber to extract the second micro-semiconductor chips from the absorber.

7. The micro-semiconductor chip transfer apparatus of claim 1, wherein the wet chip supply module comprises a liquid supply module configured to supply the first liquid, and a chip supply module configured to supply the plurality of micro-semiconductor chips.

8. The micro-semiconductor chip transfer apparatus of claim 1, wherein the wet chip supply module is further configured to supply a suspension containing the plurality of micro-semiconductor chips and the first liquid.

9. The micro-semiconductor chip transfer apparatus of claim 1, wherein the chip alignment module further comprises a supply roller to supply the absorber, a recovery roller to recover the absorber, a roller arranged between the supply roller and the recovery roller to support the absorber, and a pressing roller to press the absorber to contact with the transfer substrate.

10. The micro-semiconductor chip transfer apparatus of claim 9, wherein
the chip alignment module and the chip extraction module are arranged adjacent to each other,
the chip alignment module and the chip extraction module are provided between the supply roller and the recovery roller, and the absorber is supported between the supply roller and the recovery roller to be continuously moved from the chip alignment module to the chip extraction module.

11. The micro-semiconductor chip transfer apparatus of claim 1, wherein the chip extraction module comprises a reservoir, and a plurality of rollers arranged above the reservoir to guide and move the absorber.

12. The micro-semiconductor chip transfer apparatus of claim 1, further comprising an inspection module configured to inspect a state of the transfer substrate.

13. The micro-semiconductor chip transfer apparatus of claim 12, further comprising a controller configured to control operations of the wet chip supply module and the chip alignment module, based on a result of inspection performed by the inspection module.

14. The micro-semiconductor chip transfer apparatus of claim 1, further comprising a cleaning module configured to remove dummy micro-semiconductor chips remaining on the surface of the transfer substrate.

15. The micro-semiconductor chip transfer apparatus of claim 1, wherein the chip extraction module further comprises a recovery module configured to recover the second micro-semiconductor chips separated from the transfer substrate.

16. The micro-semiconductor chip transfer apparatus of claim 1, wherein the chip extraction module further comprises a filtration module configured to separate impurities from the micro-semiconductor chips extracted by the chip extraction module.

17. The micro-semiconductor chip transfer apparatus of claim 1, further comprising an antistatic module configured to supply, onto the transfer substrate, ions for preventing an occurrence of static electricity.

18. The micro-semiconductor chip transfer apparatus of claim 1, wherein the absorber comprises a woven, a tissue, polyester fiber, paper, or a wiper.

19. The micro-semiconductor chip transfer apparatus of claim 1, wherein the micro-semiconductor chip is one of a micro-light-emitting device, a pressure sensor, a photodiode, a thermistor, or a piezoelectric device.

20. A chip extraction apparatus comprising:
a holder configured to hold an absorber configured to move along a surface of a transfer substrate to absorb liquid from a transfer substrate during a wet alignment process;
a cleaner configured to release micro-semiconductor chips attached to the absorber during the wet alignment process; and
a container configured to collected the micro-semiconductor chips released from the absorber.

21. The chip extraction apparatus of claim 20, wherein the cleaner comprises:
a liquid spray cleaner configured to spray liquid onto the absorber to release the micro-semiconductor chips attached to the absorber during the wet alignment process.

* * * * *